(12) United States Patent
Ahn et al.

(10) Patent No.: US 12,054,849 B2
(45) Date of Patent: Aug. 6, 2024

(54) APPARATUS AND METHOD FOR MANUFACTURING HEXAGONAL SILICON CRYSTAL

(71) Applicants: Byunggeun Ahn, Busan (KR); Jae Hak Lee, Seoul (KR)

(72) Inventors: Hyung Soo Ahn, Busan (KR); Jae Hak Lee, Seoul (KR)

(73) Assignees: Byungguen Anh, Busan (KR); Jae Hak Lee, Seoul (KR)

( * ) Notice: Subject to any disclaimer, the term of this patent is extended or adjusted under 35 U.S.C. 154(b) by 241 days.

(21) Appl. No.: 17/630,553

(22) PCT Filed: Jun. 10, 2020

(86) PCT No.: PCT/KR2020/007527
§ 371 (c)(1),
(2) Date: Jan. 27, 2022

(87) PCT Pub. No.: WO2021/025278
PCT Pub. Date: Feb. 11, 2021

(65) Prior Publication Data
US 2022/0251727 A1    Aug. 11, 2022

(30) Foreign Application Priority Data
Aug. 2, 2019  (KR) .......................... 10-2019-0094306

(51) Int. Cl.
*C30B 25/14* (2006.01)
*C23C 16/24* (2006.01)
(Continued)

(52) U.S. Cl.
CPC .............. *C30B 25/14* (2013.01); *C23C 16/24* (2013.01); *C23C 16/303* (2013.01);
(Continued)

(58) Field of Classification Search
CPC ......... C30B 25/14; C30B 25/10; C30B 25/12; C30B 25/16; C30B 25/20; C30B 29/06;
(Continued)

(56) References Cited

U.S. PATENT DOCUMENTS

2007/0277731 A1* 12/2007 Han ........................ C30B 35/00
117/100
2009/0068407 A1* 3/2009 Abrosimov ............. C30B 13/20
428/156

FOREIGN PATENT DOCUMENTS

JP    2011-168490    9/2011
JP    5045388    10/2012
(Continued)

OTHER PUBLICATIONS

A. De and C. E. Pryor, "Electronic structure and optical properties of Si, Ge and diamond in the lonsdaleite phase" J. Phys.: Condens. Matter 26, (2014) 045801, Jan. 2014
(Continued)

*Primary Examiner* — Robert M Kunemund
(74) *Attorney, Agent, or Firm* — LEX IP MEISTER, PLLC

(57) ABSTRACT

An apparatus for manufacturing hexagonal Si crystal includes: a reaction tube; a mixed source part placed on one side in the reaction tube, for receiving mixed source of silicon, aluminum, and gallium which are in a solid state; a halogenation reaction gas supply pipe for supplying a halogenation reaction gas to the mixed source part; a substrate mounting part placed on the other side in the reaction tube, for mounting a first substrate, wherein the first substrate is disposed such that a crystal growth surface of the first substrate faces downwards; a nitrification reaction gas supply pipe for supplying a nitrification reaction gas to the substrate mounting part; and a heater for heating the reaction (Continued)

tube. The heater heats the reaction tube in a temperature range of 1100-1300° C.

18 Claims, 22 Drawing Sheets

(51) Int. Cl.
```
C23C 16/30      (2006.01)
C23C 16/448     (2006.01)
C23C 16/455     (2006.01)
C23C 16/458     (2006.01)
C30B 25/10      (2006.01)
C30B 25/12      (2006.01)
C30B 25/16      (2006.01)
C30B 25/20      (2006.01)
C30B 29/06      (2006.01)
C30B 29/40      (2006.01)
C30B 29/66      (2006.01)
```
(52) U.S. Cl.
CPC .... *C23C 16/4488* (2013.01); *C23C 16/45512* (2013.01); *C23C 16/4583* (2013.01); *C30B 25/10* (2013.01); *C30B 25/12* (2013.01); *C30B 25/16* (2013.01); *C30B 25/20* (2013.01); *C30B 29/06* (2013.01); *C30B 29/403* (2013.01); *C30B 29/66* (2013.01)

(58) Field of Classification Search
CPC ....... C30B 29/403; C30B 29/66; C23C 16/24; C23C 16/4488; C23C 16/45512; C23C 16/4583
See application file for complete search history.

(56) References Cited

FOREIGN PATENT DOCUMENTS

| | | |
|---|---|---|
| JP | 2013-116851 | 6/2013 |
| KR | 10-2002-0018557 | 3/2002 |
| KR | 10-2011-0069770 | 6/2011 |
| KR | 10-2012-0034427 | 4/2012 |
| KR | 10-2013-0058012 | 6/2013 |
| KR | 10-2016-0067082 | 6/2016 |
| KR | 10-2017-0117419 | 10/2017 |
| KR | 10-1841032 | 3/2018 |

OTHER PUBLICATIONS

A. F. I. Morral, J. Arbiol, J. D. Prades and A. Cirera, "Synthesis of silicon nanowires with wurtzite crystalline structure by using standard chemical vapor deposition" Adv. Mater. 19 (2007) 1347, 2007.
B. R. Wu, "First-principles study on the high-pressure behavior of the zone-center modes of lonsdaleite silicon", Phys. Rev. B 61 (2000) Jan. 5, 2000.
Bennett E. Smith, Xuezhe Zhou, Paden B. Roder, Evan H. Abramson, and Peter J. Pauzauskie, "Recovery of hexagonal Si-IV nanowires from extreme GPa pressure" Journal of Applied Physics 119, 185902 (2016), May 2016.
H. I. T. Hauge, M.I A. Verheijen, S. Conesa-Boj, T. Etzelstorfer, M. Watzinger, D. Kriegner, I. Zardo, C. Fasolato, F. Capitani, P. Postorino, S. Kolling, A. Li, S. Assali, J. Stangl and E. P. A. M. Bakkers, "Hexagonal Silicon Realized", Nano Lett. 15, 9 (2015) 5855-5860, Jul. 31, 2015.
H. J. Xiang, B. Huang, E. J. Kan, S.- H. Wei, and X. G. Gong, "Towards direct-gap silicon phases by the inverse band structure design approach" Phys. Rev. Lett. 110 (2013) 118702, Mar. 2013.
H. M. Jennings and M. H. Richman, "A Hexagonal (Wurtzite) Form of Silicon", Science 193 (4259) (1976) 1242, Sep. 1976.

J. H. Park, S. O. Choi, S. Seo, Y. B. Choy and M. R. Prausnitz, "A microneedle roller for transdermal drug delivery", European Journal of Pharmaceutics and Biopharmaceutics 76 (2010) 282-289, Jul. 2010.
J. S. Kasper and R. H. Wentor JR., "Hexagonal (Wurtzite) Silicon", Science 197 (4303) (1977), 599, Aug. 1977.
K. U. M. Kumar and M. G. Krishna, "Chromium-Induced Nanocrystallization of a-Si Thin Films into theWurtzite Structure", Journal of Nanomaterials 2008(2008) Article ID 736534, Feb. 6, 2008.
L., Lin. and A. P. Pisano, "Silicon-Processed Microneedles", Journal of Microelectromechanical Systems, 8, 78 (1999), Mar. 1999.
M. Khorasaninejad, J. Walia and S. S. Saini, "Enhanced first-order Raman scattering from arrays of vertical silicon nanowires", Nanotechnology, 23, 275706 (2012), Jun. 2012.
M. Luyao, L. Sudarat, D. Joshua and M. Stephen, "Direct electrochemical deposition of crystalline silicon nanowires at T 60 °C", Rsc Adv. 6, 78818 (2016), 2016.
M. R. Prausnitz and R. Langer, "Transdermal drug delivery", Nat. Biotechnol. 26, 1261 (2008), Nov. 2008.
M. Raya-Moreno, H. Aramberri, J. A. Seijas-Bellido, X. Cartoixa and R. Rurali, "Thermal conductivity of hexagonal Si and hexagonal Si nanowires from first-principles" Appl. Phys. Lett. 111 (2017) 032107, Jul. 2017.
Q. Fan, C. Chai, Q. Wei, H. Yan, Y. Zhao, Y. Yang, X. Yu, Y. Liu, M. Xing, J. Zhang and R. Yao, "Novel silicon allotropes: Stability, mechanical, and electronic properties" J. Appl. Phys. 118 (2015) 185704, Nov. 2015.
Q. Q. Wang, B. Xu, J. Sun, H. Y. Liu, Z. S. Zhao, D. L. Yu, C. Z. Fan, and J. L. He, "Direct Band Gap Silicon Allotropes" J. Am. Chem. Soc. 136 (2014) 9826-9829, Jun. 27, 2014.
R. H. Wentorf Jr., J. S. Kasper, "Two New Forms of Silicon", Science 139(3552) (1963) 338, Jan. 1963.
R. K. Sivamani, D. Liepmann and H. I. Maibach, "Microneedles and transdermal applications", Expert Opinion on Drug Delivery 4, 19 (2007), Feb. 2007.
S. Botti, J. A. Flores-Livas, M. Amsler, S. Goedecker and M. A. L. Marques, "Low-energy silicon allotropes with strong absorption in the visible for photovoltaic applications"Phys. Rev. B 86 (2012) 121204, Sep. 2012.
S. J. Paik, S. Byun, J. M. Lim, Y. Park, A. Lee, S. Chung, J. Chang, K. Chun and D. Cho, "In-plane single-crystal-silicon microneedles for minimally invasive microfluid systems", Sensors and Actuators A: Physical, 114, 276( 2004), Mar. 2004.
S. P. Narayanan and S. Raghavan, "Fabrication and characterization of gold-coated solid silicon microneedles with improved biocompatibility", The International Journal of Advanced Manufacturing Technology (2019) 104:3327-3333, Sep. 2018.
S. Piscanec, M. Cantoro, A. C. Ferrari, J. A. Zapien, Y. Lifshitz, S. T. Lee, S. Hofmann and J. Robertson, "Raman spectroscopy of silicon nanowires", Phys. Rev. B 68, 241312R (2003), Dec. 2003.
S. Q. Wang and H. Q. Ye, "First-principles study on the lonsdaleite phases of C, Si and Ge" Journal of Physics: Condensed Matter 15 (2003) L197-L202, Mar. 2003.
T. Gratieri, I. Alberti, M. Lapteva and Y.N. Kalia, "Next generation intra- and transdermal therapeutic systems: Using non- and minimally-invasive technologies to increase drug delivery into and across the skin", European Journal of Pharmaceutical Sciences 50 (2013) 609-622, Apr. 2013.
V. O. Yukhymchuk, V. M. Dzhagan, M. Ya. Valakh, V. P. Klad'ko, O. J. Gudymenko, V. S. Yefanov and D. R. T. Zahn, "In situ photoluminescence/Raman study of reversible photo-induced structural transformation of nc-Si", Materials Research Express 1 (2014) 045905, Nov. 2014.
Y. C. Kim, J. H. Park and M. R. Prausnitz, "Microneedles for drug and vaccine delivery", Adv. Drug. Deliv. Rev. 64, 1547 (2012), Nov. 2012.
Y. Guo, Q. Wang, Y. Kawazoe and P. Jena, "A new silicon phase with direct band gap and novel optoelectronic properties" Sci. Rep. 5 (2015) 14342, Sep. 2015.
Y. Ren, P. Leubner, M. A. Verheijen, J. E.M. Haverkort and E. P. A.M Bakkers, "Hexagonal Silicon grown from higher order Silanes", Nanotechnology 30(29) (2019) 295602, Apr. 2019.

(56) References Cited

OTHER PUBLICATIONS

Z. He, J.- L. Maurice, Q. Lia and D. Pribatb, "Direct evidence of 2H hexagonal Si in Si nanowires", Nanoscale 11(2019) 4846-4853, Feb. 2019.
Volker Schmidt et al., "Silicon Nanowires: A Review on Aspects of their Growth and their Electrical Properties", Adv. Mater. 2009, 21, 2681-2702, Jul. 2009.
H.F. Yan et al., "Growth of amorphous silicon nanowires via a solid-liquid-solid mechanism", Chemical Physics Letters 323 (2000) 224-228, Jun. 2000.
F. A. Martinsen et al., "Bulk fabrication and properties of solar grade silicon microwires", Apl Materials 2, 116108 (2014), Nov. 2014.
Won Il Park et al., "Controlled Synthesis of Millimeter-Long Silicon Nanowires with Uniform Electronic Properties", Nano Lett., vol. 8, No. 9, 2008, Aug. 2008.
Graham Fisher et al., "Silicon Crystal Growth and Wafer Technologies", Proceedings of the IEEE vol. 100, May 13, 2012.
KIPO, PCT Search Report & Written Opinion of Application No. PCT/KR2020/007527, dated Sep. 23, 2020.

\* cited by examiner

【DRAWINGS】
【Figure 1】
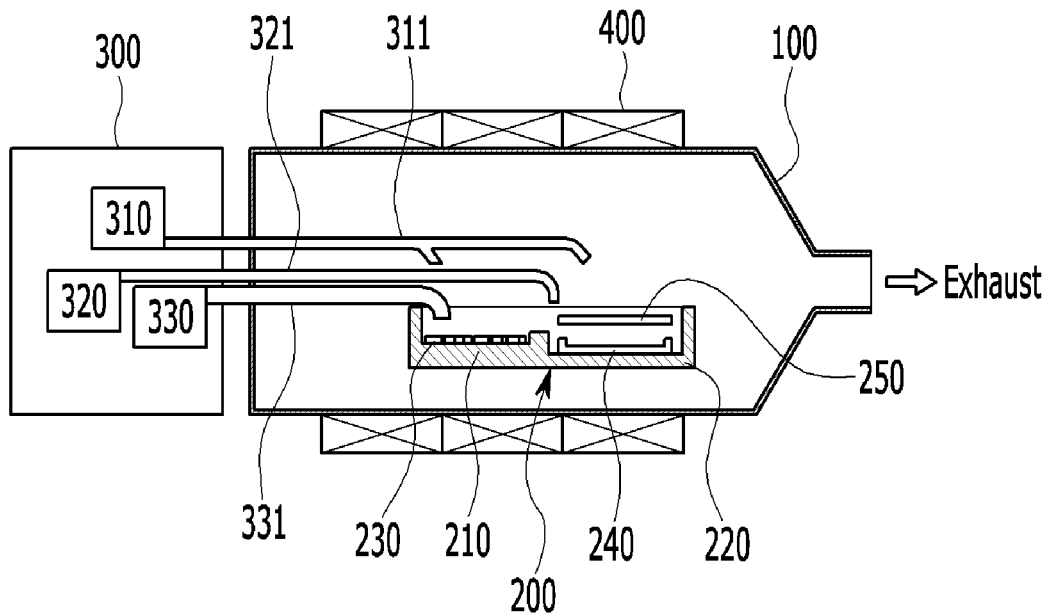
【Figure 2】
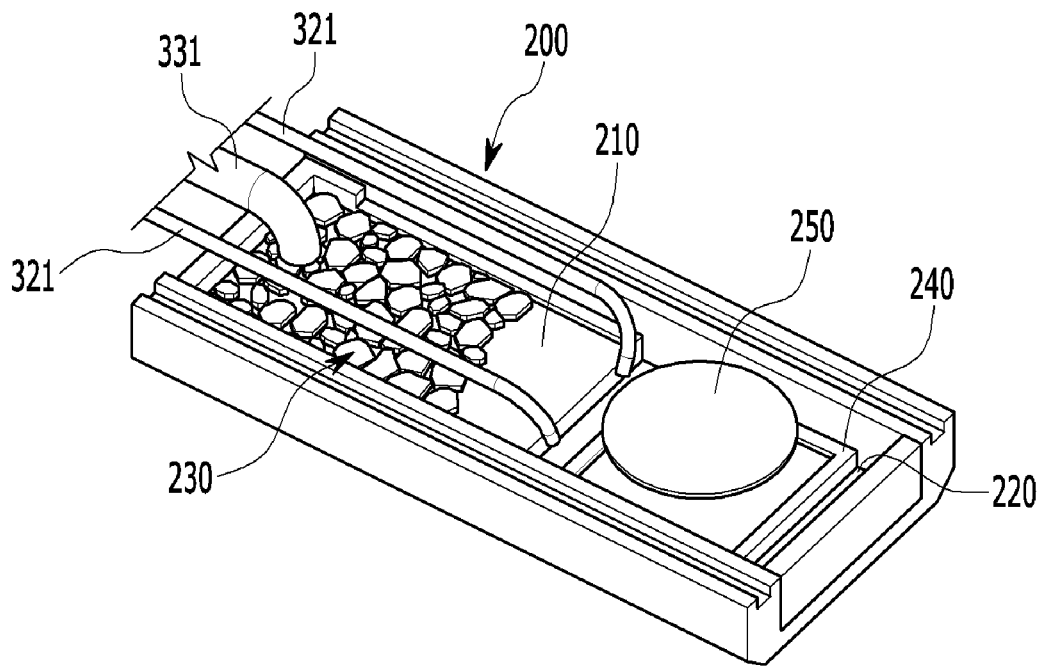

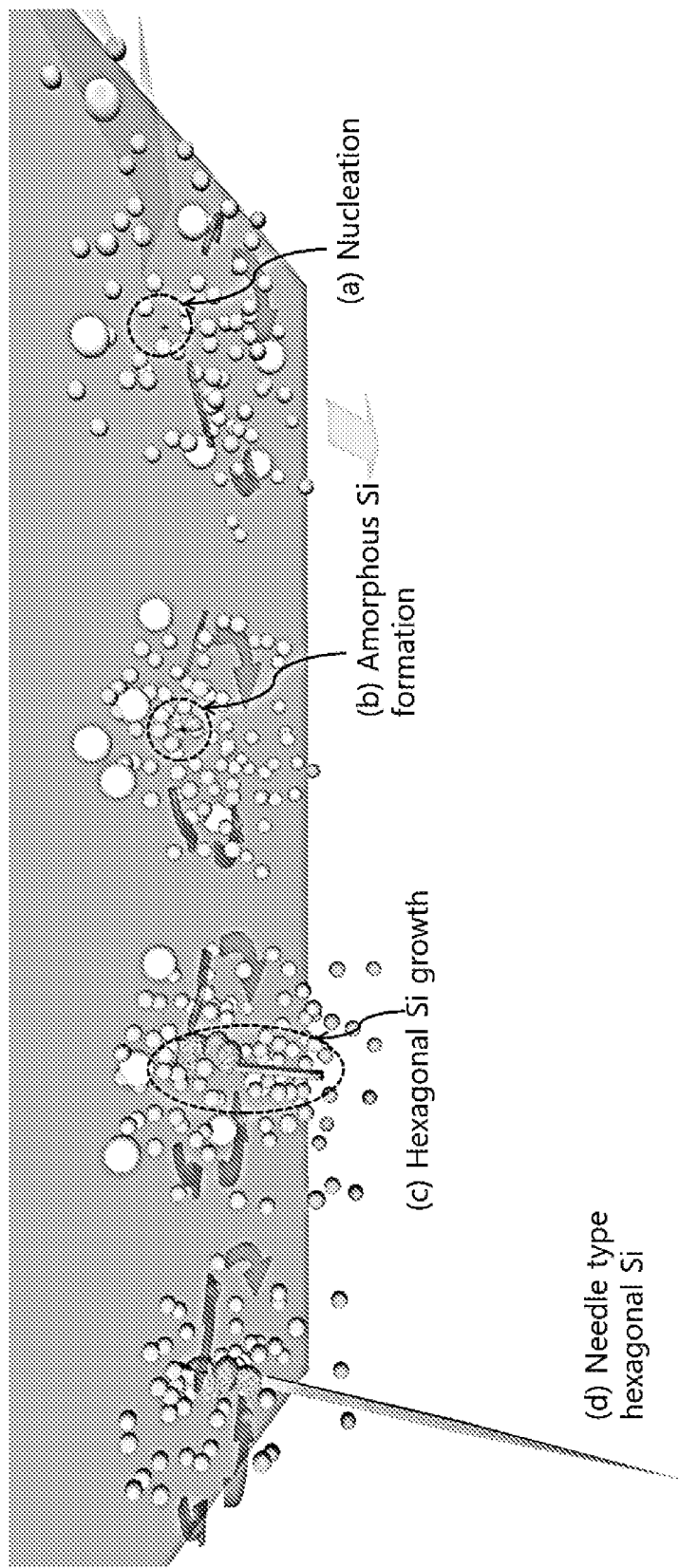
[Figure 3]

[Figure 4]
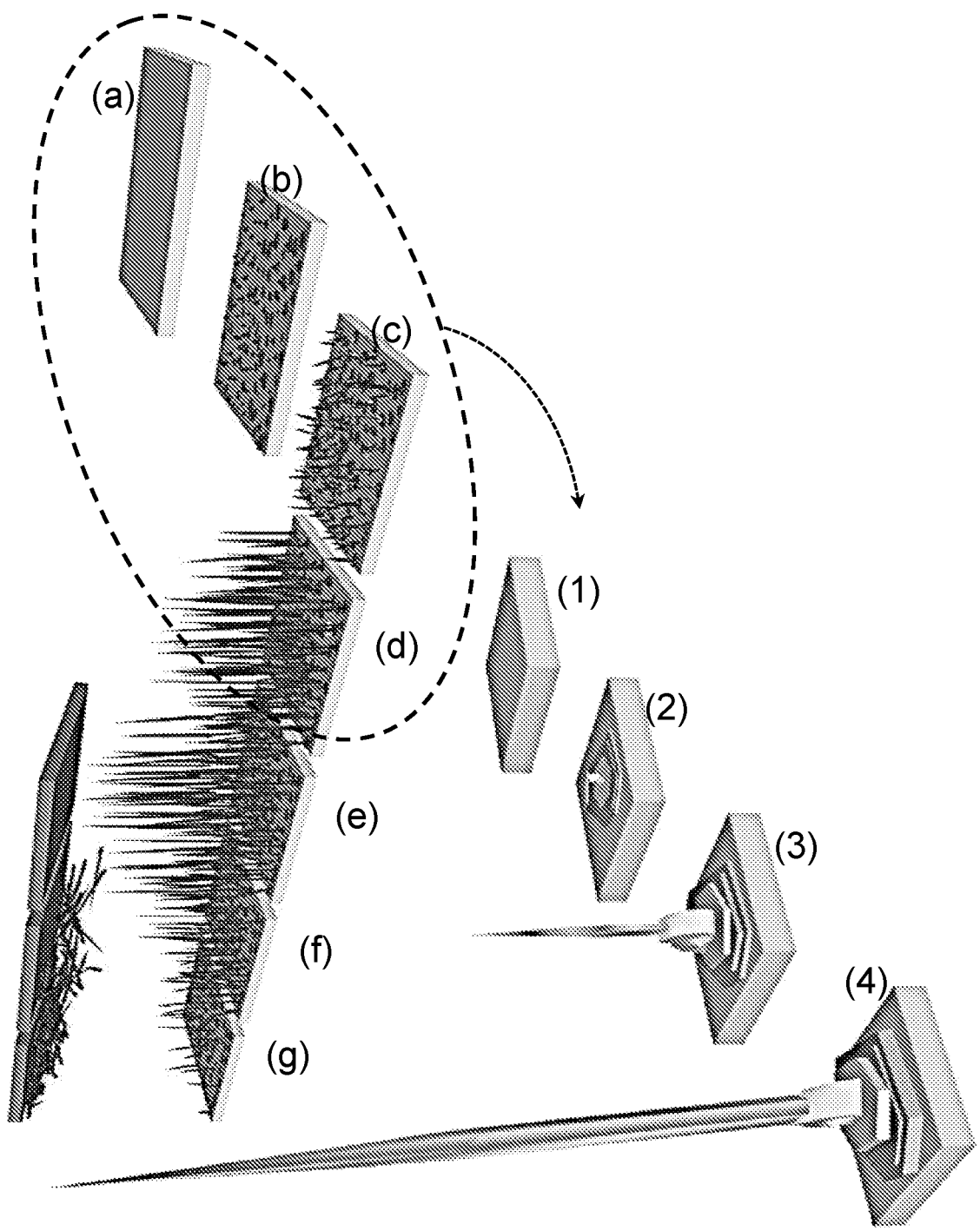

[Figure 5A]
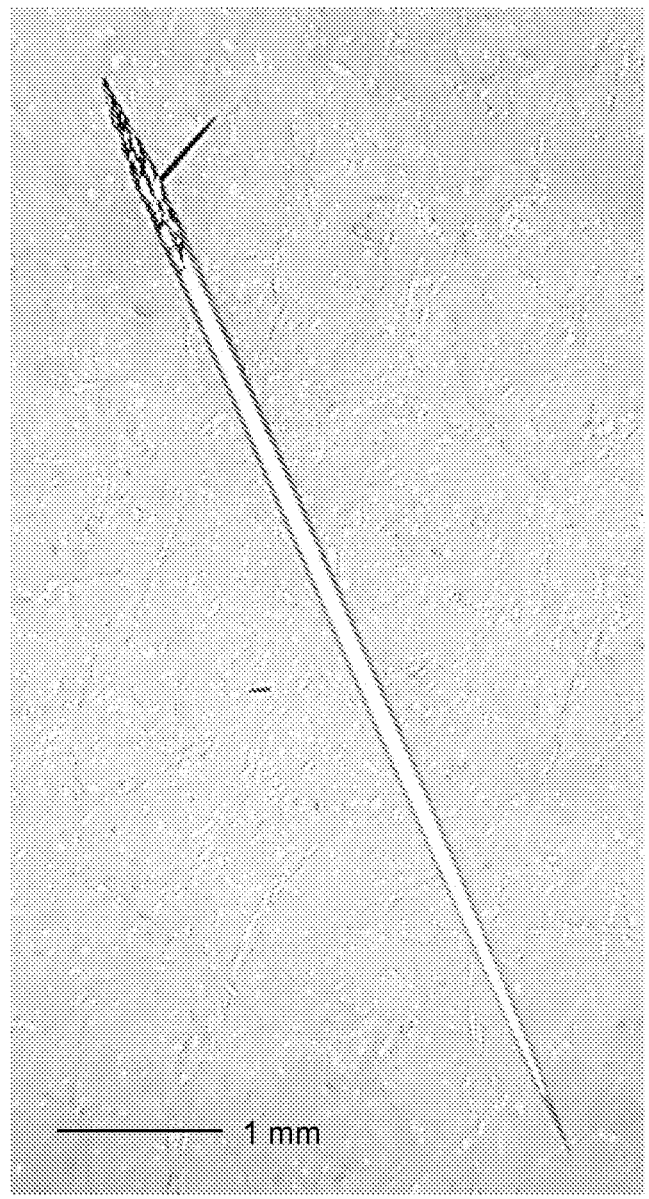

【Figure 5B】
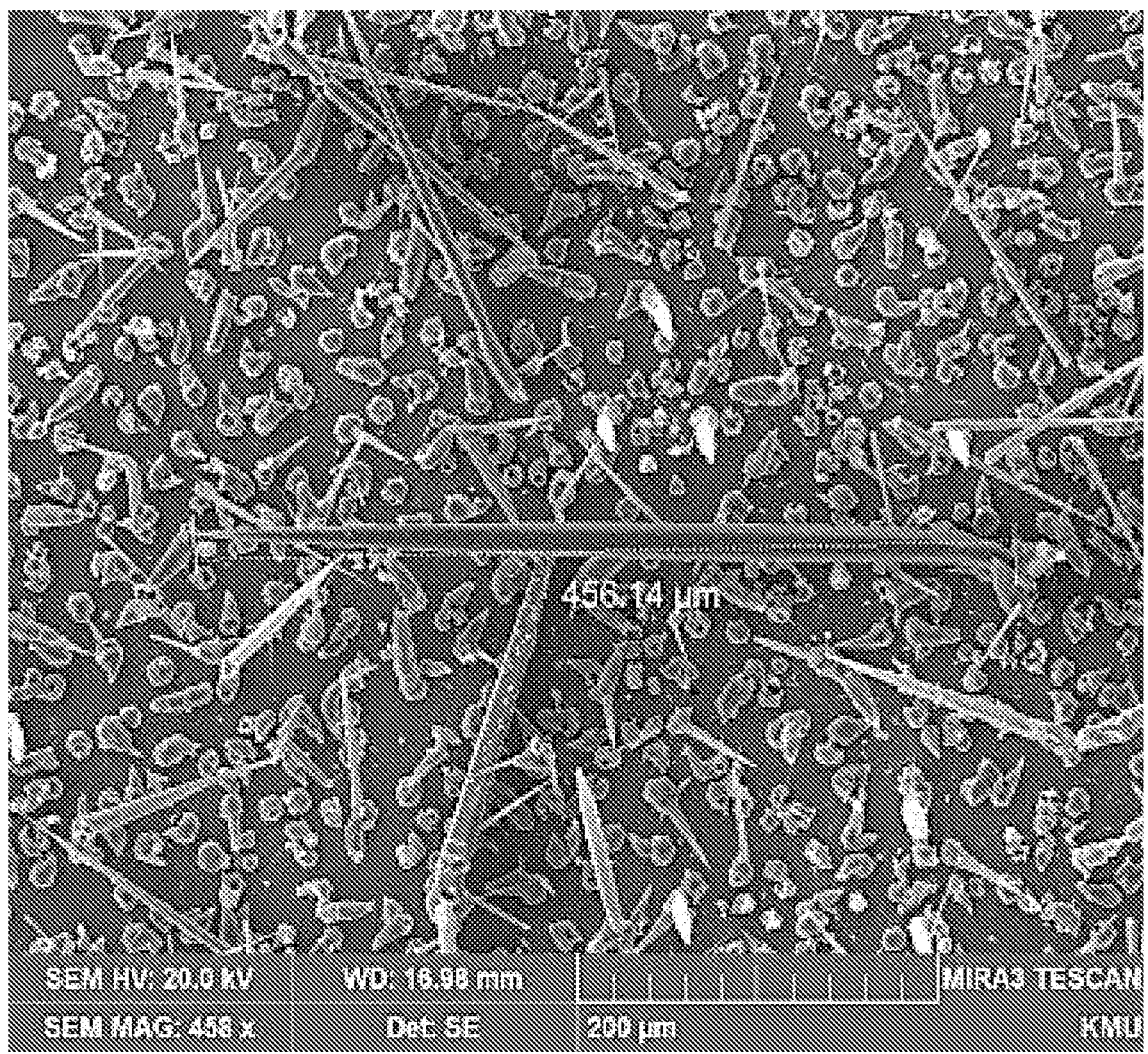

[Figure 5C]
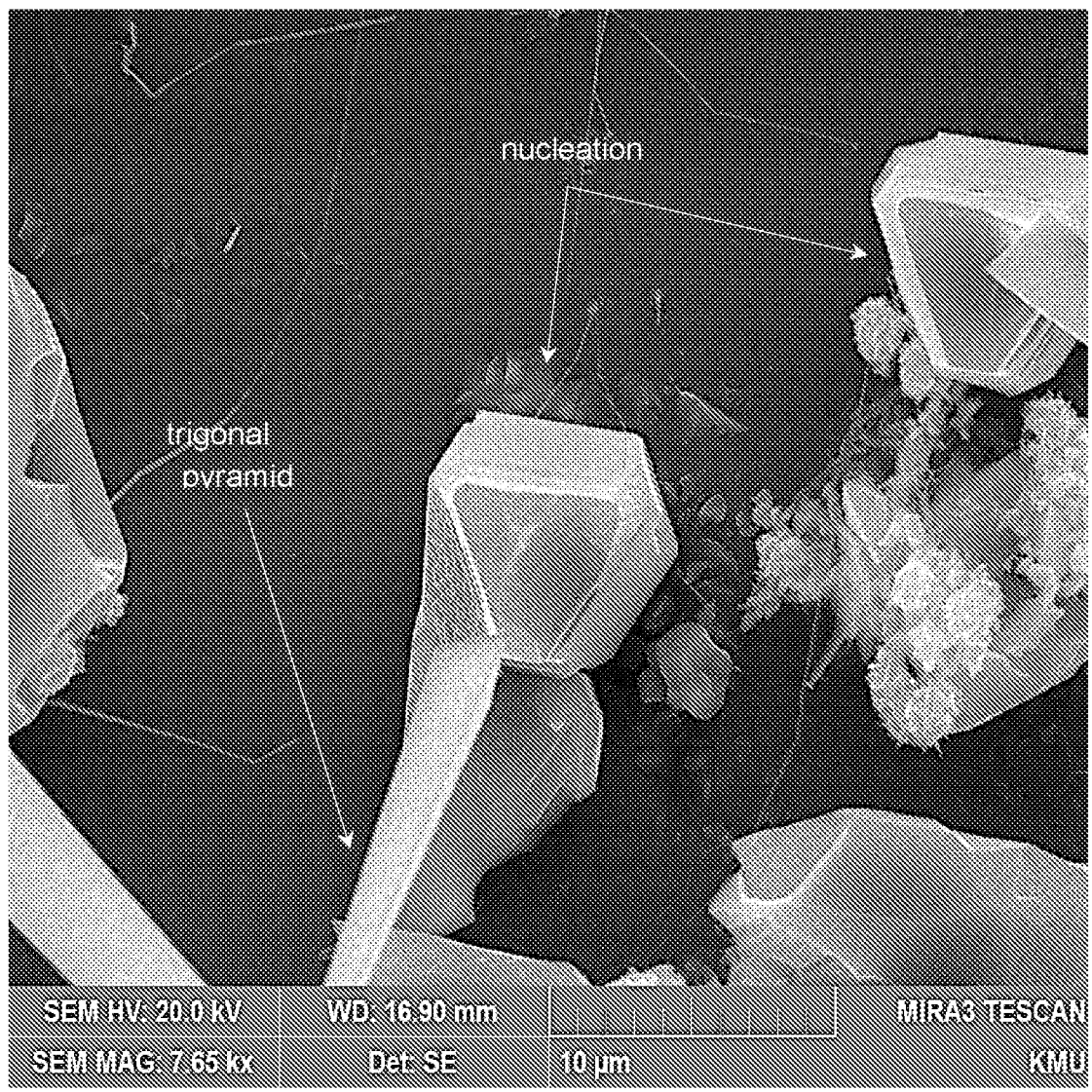

【Figure 5D】
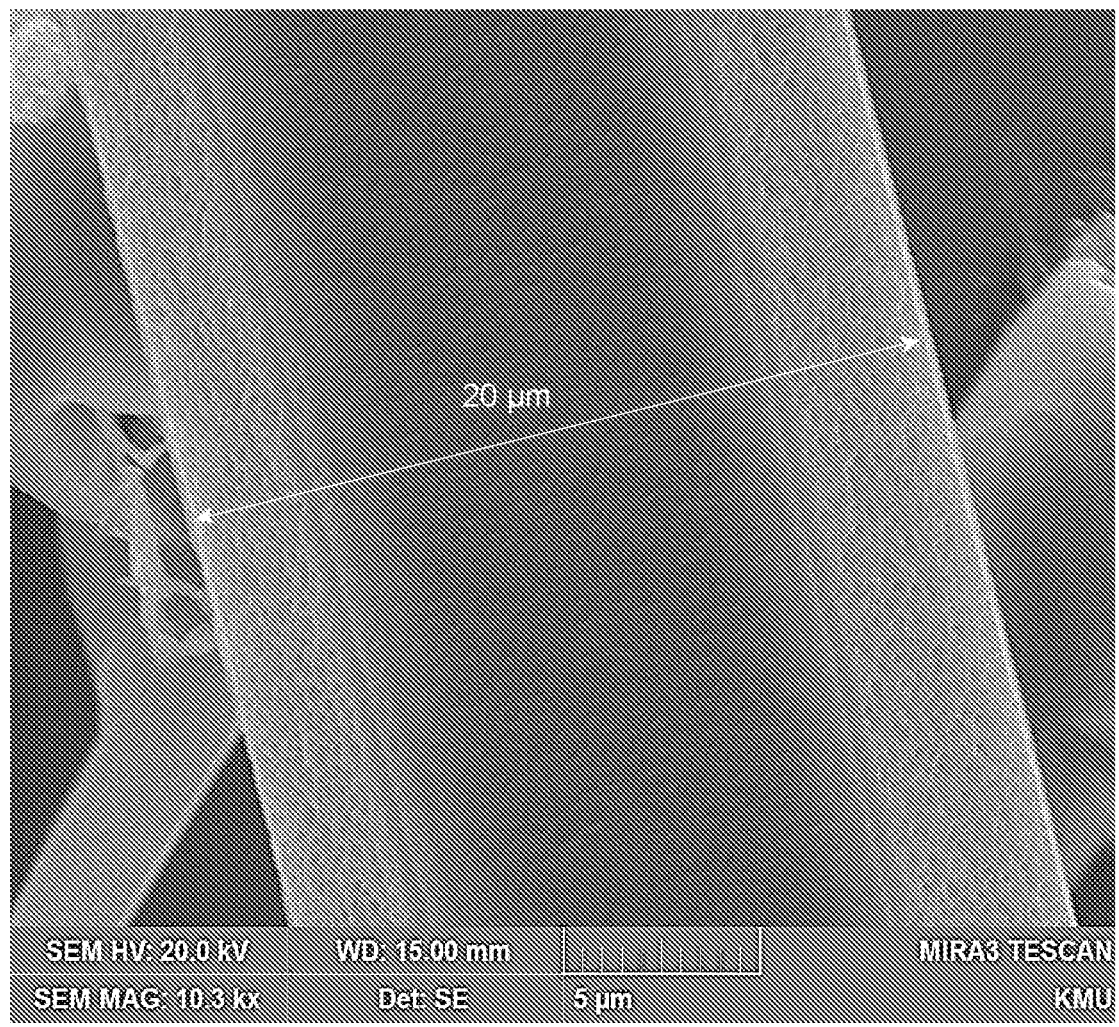

[Figure 5E]
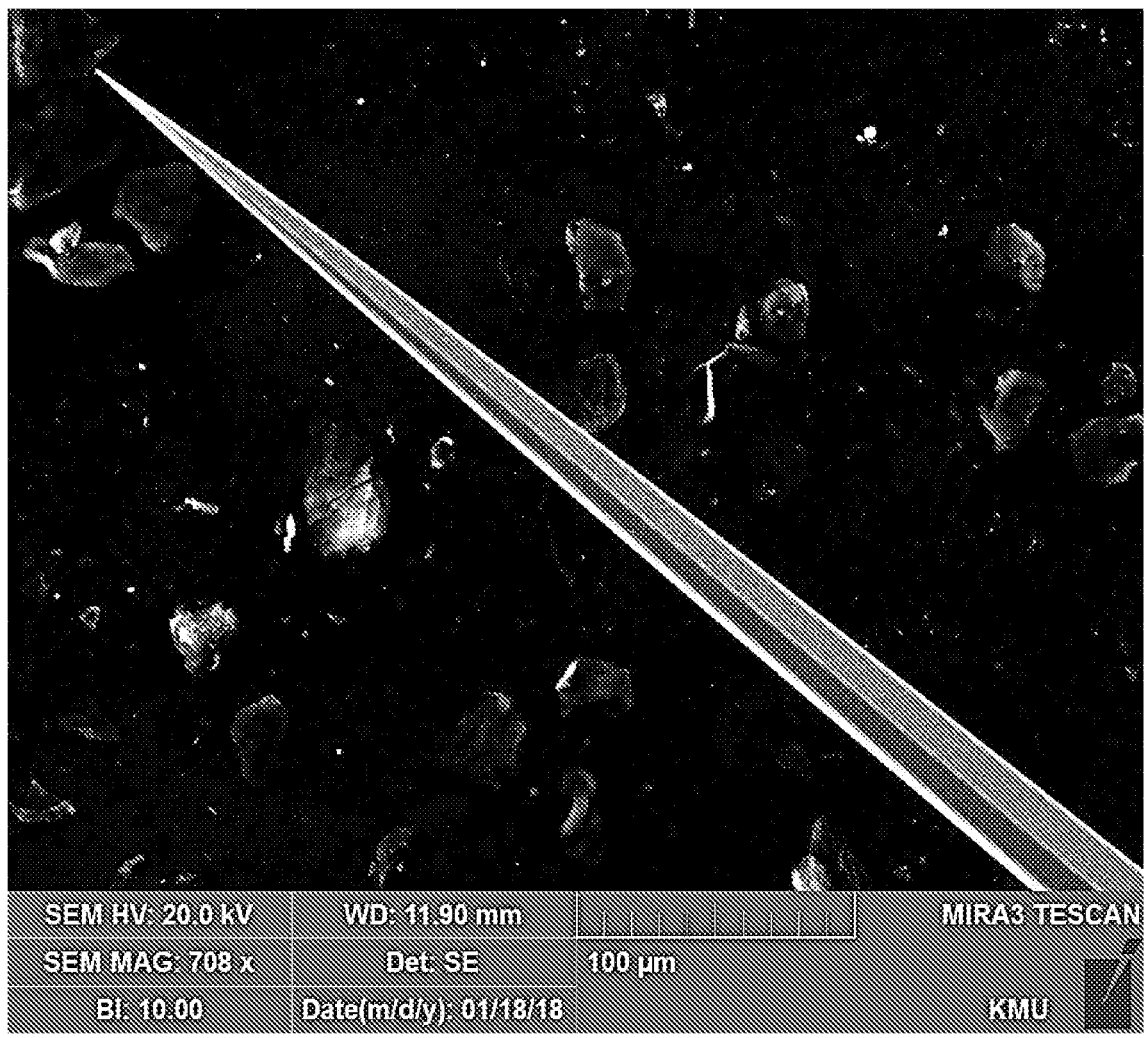

【Figure 5F】
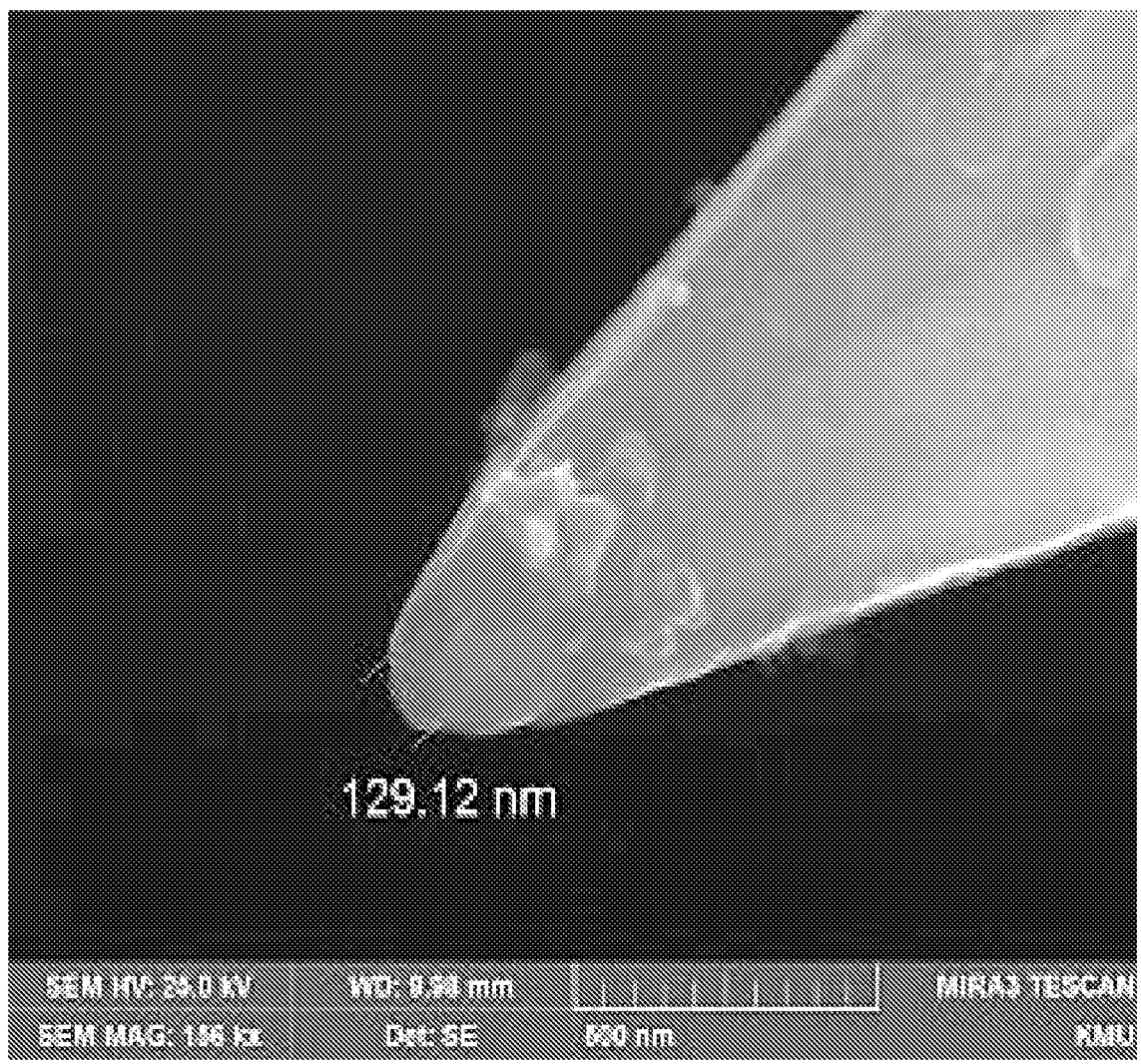

【Figure 5G】
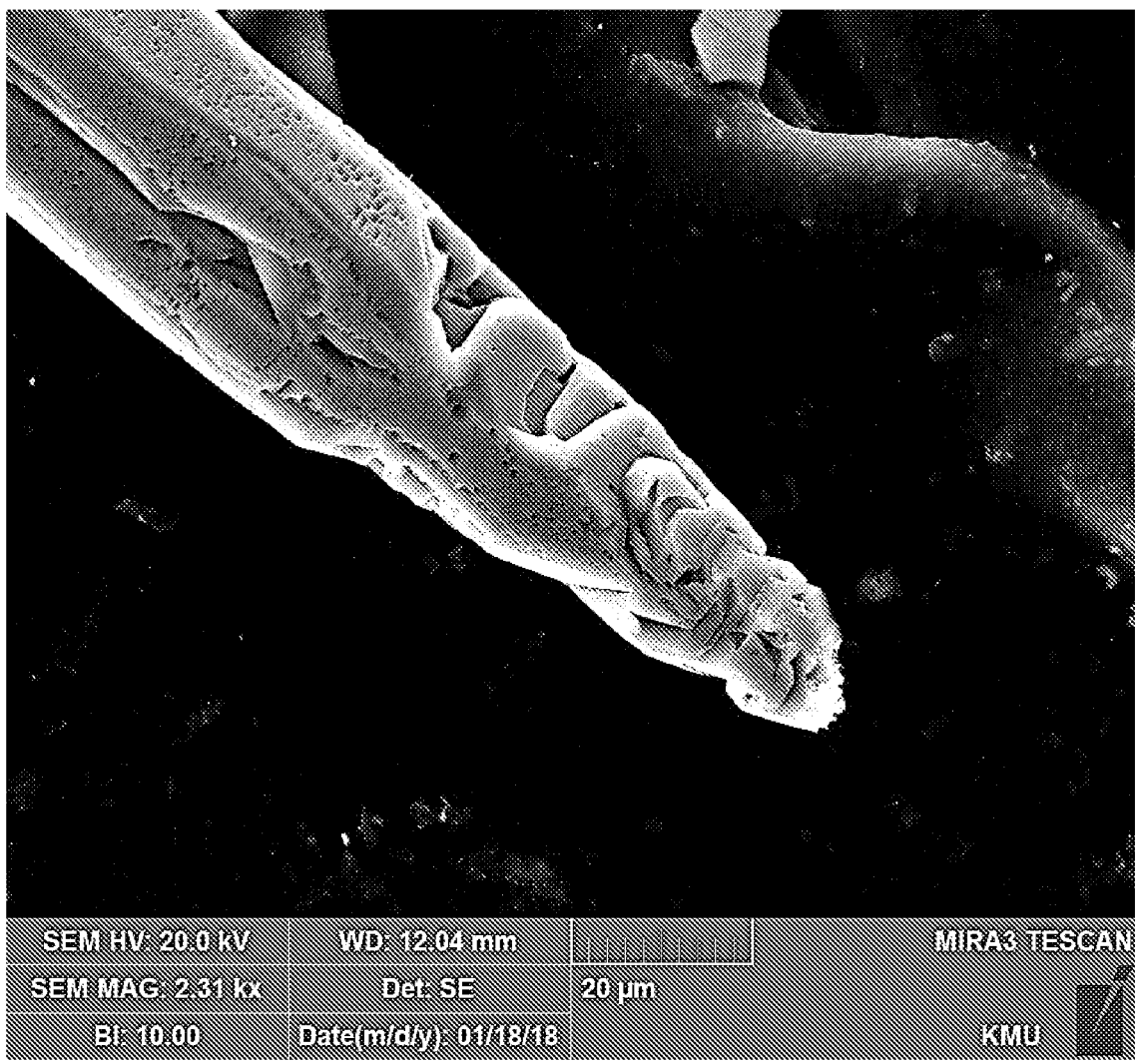

[Figure 6A]
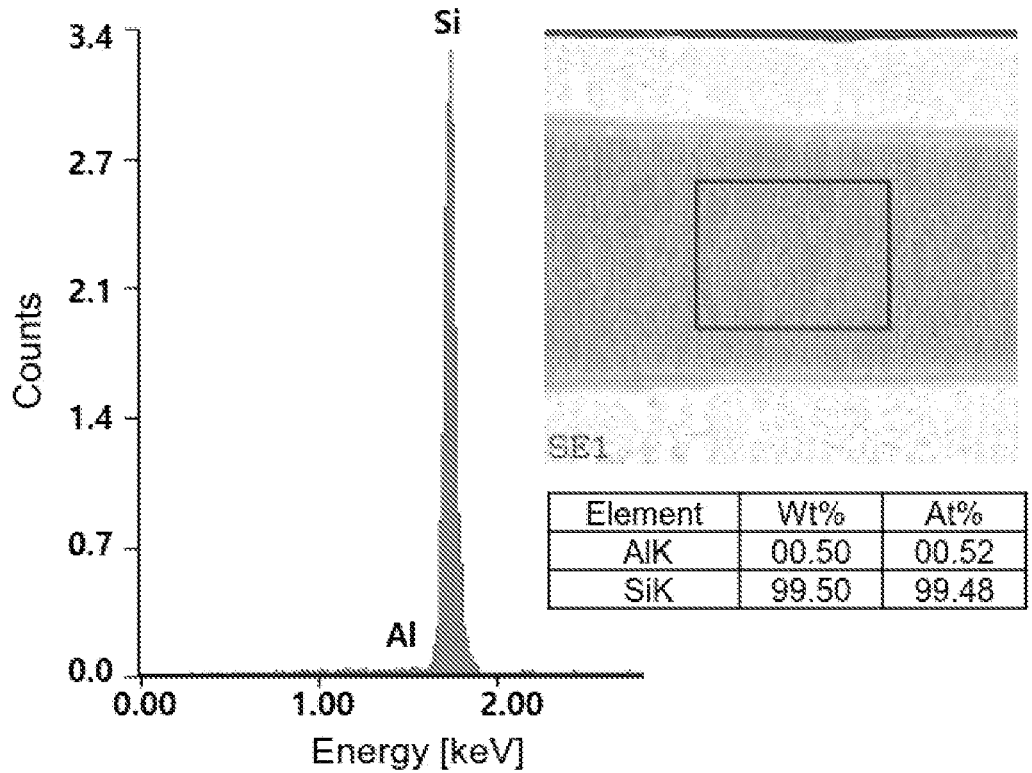
[Figure 6B]
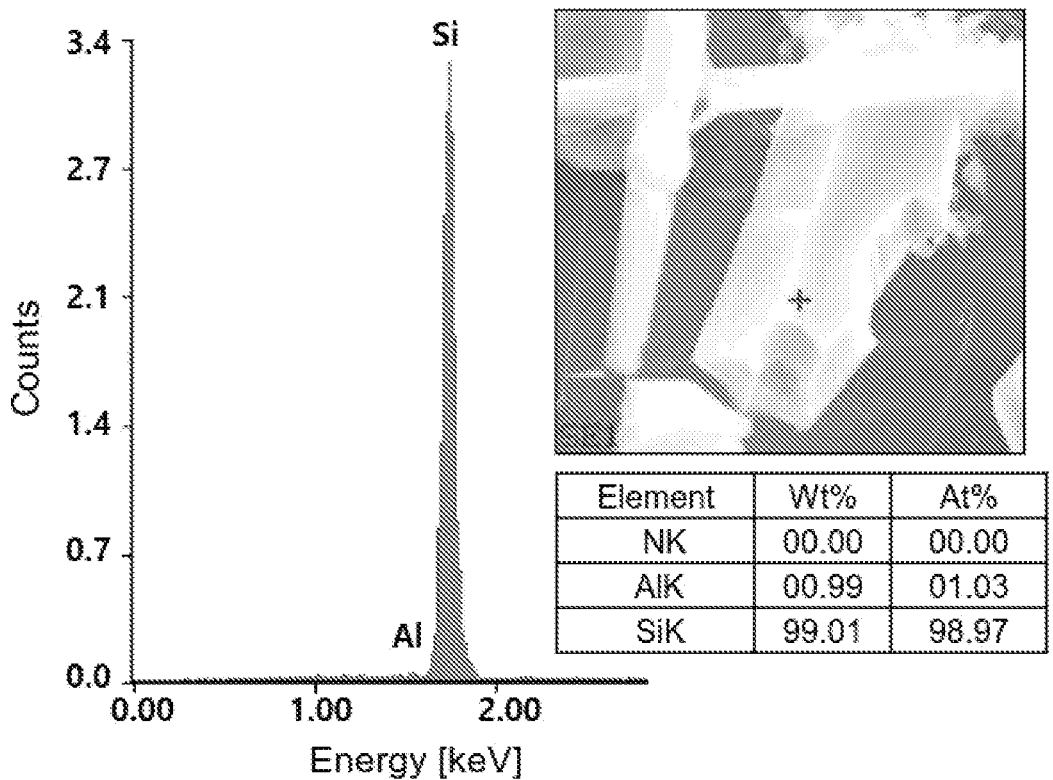

[Figure 7A]
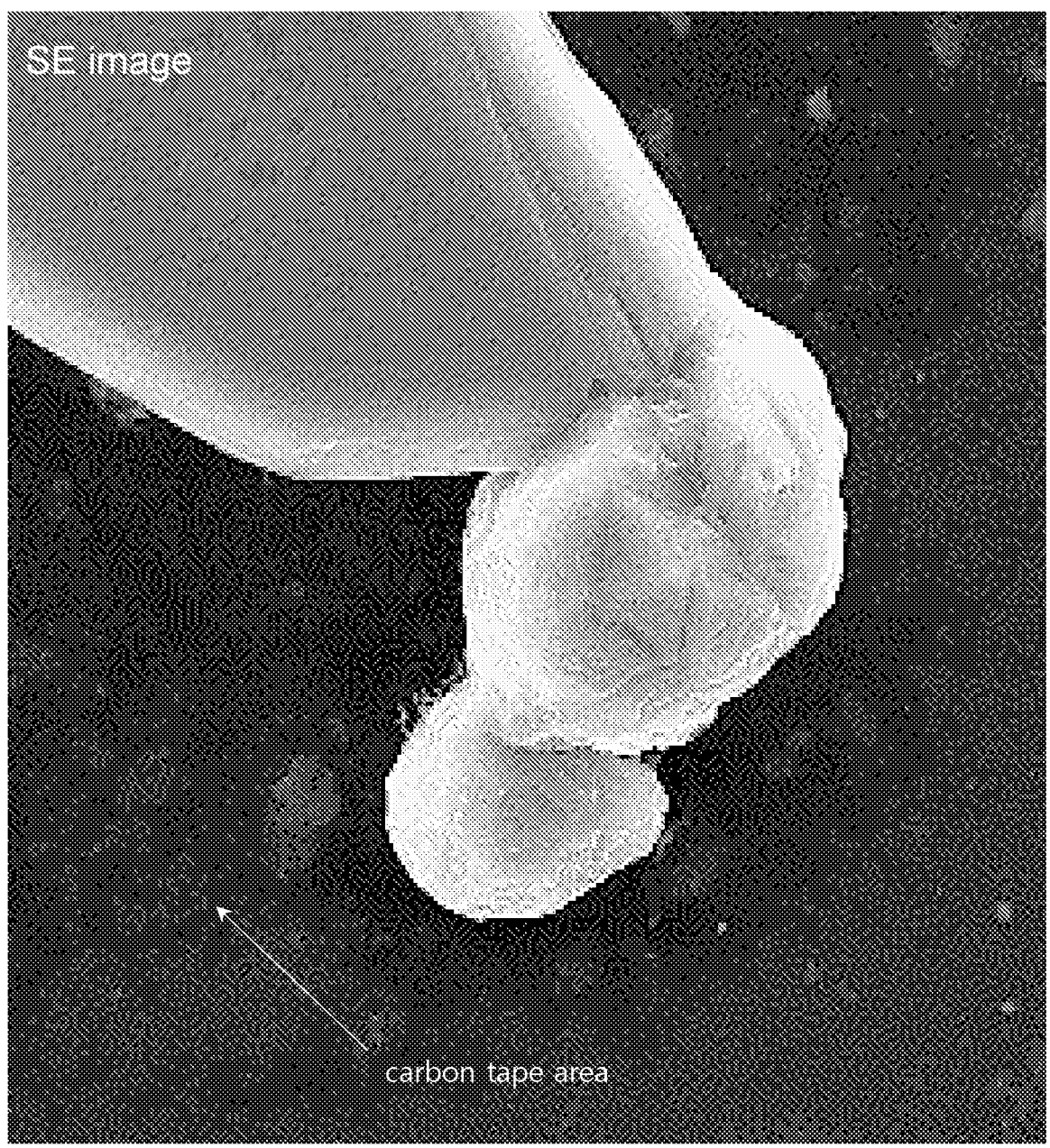

[Figure 7B]
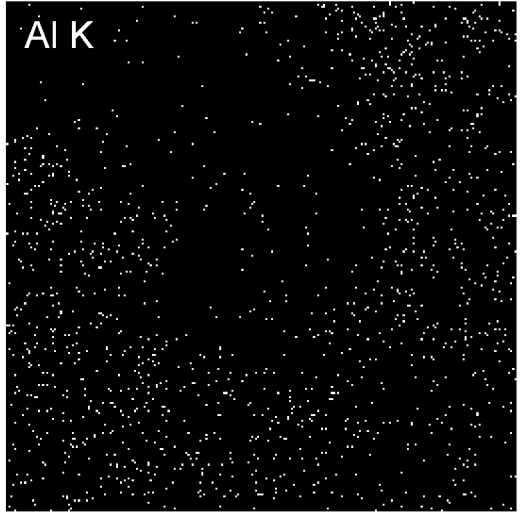
[Figure 7C]
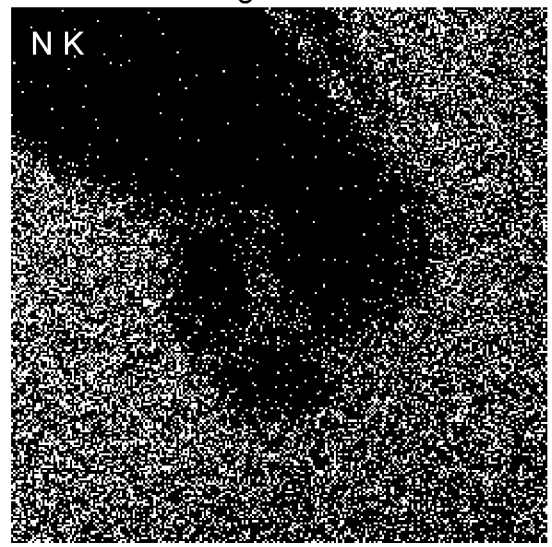
[Figure 7D]
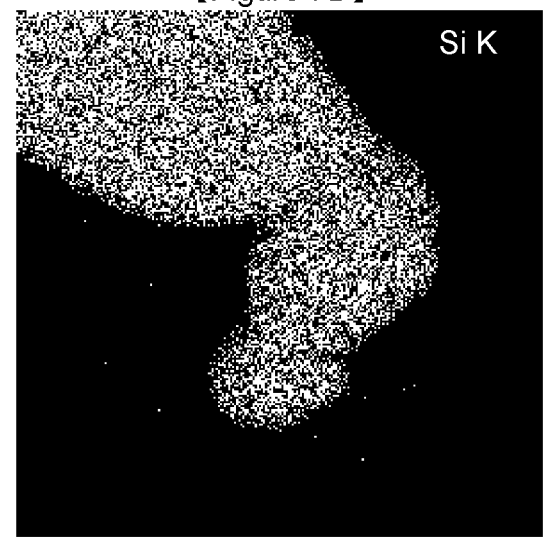

[Figure 8A]
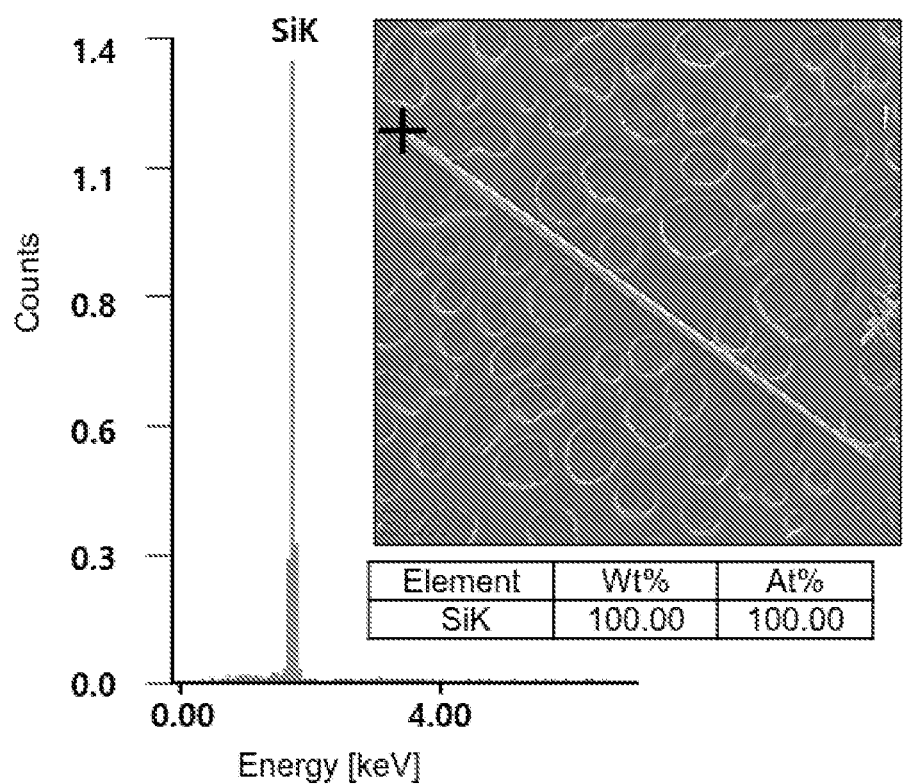
[Figure 8B]
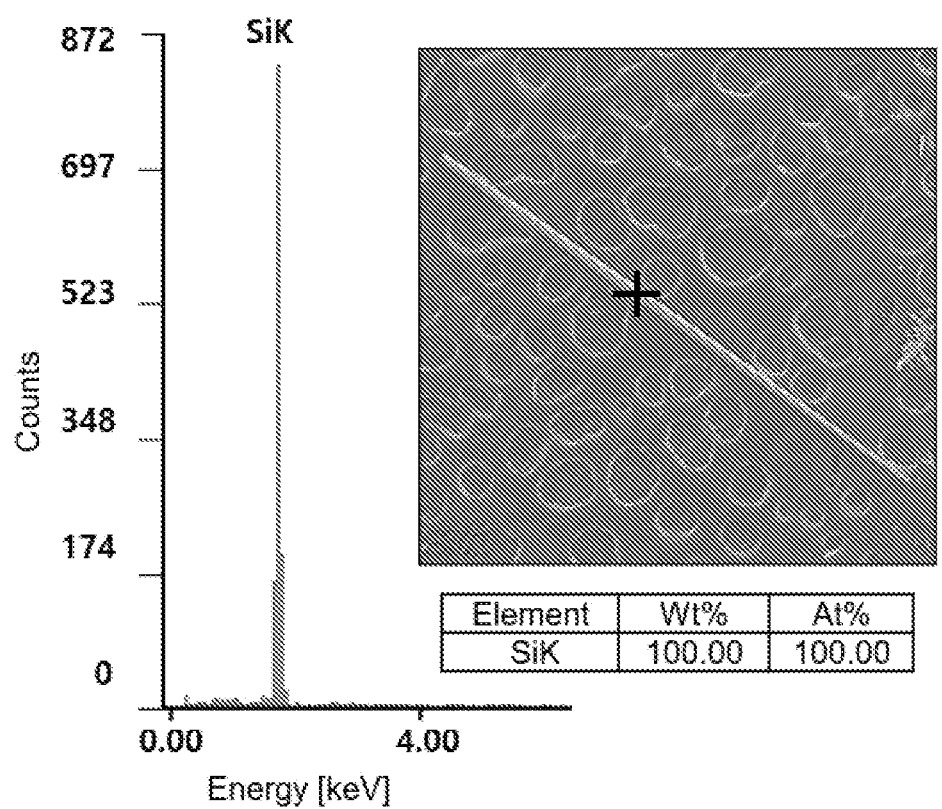

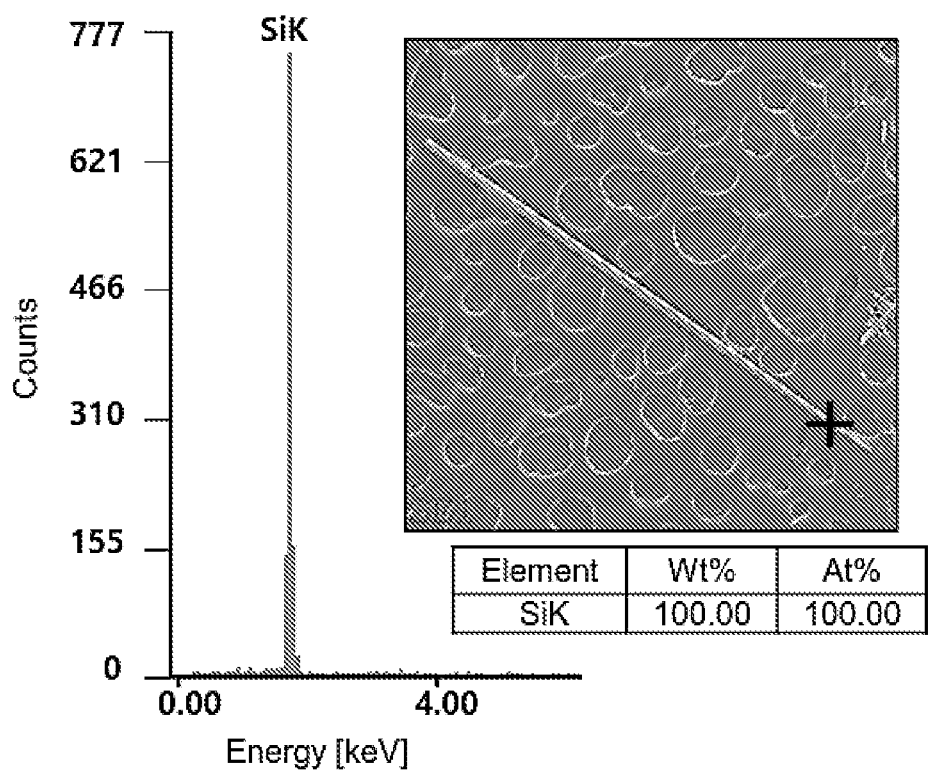

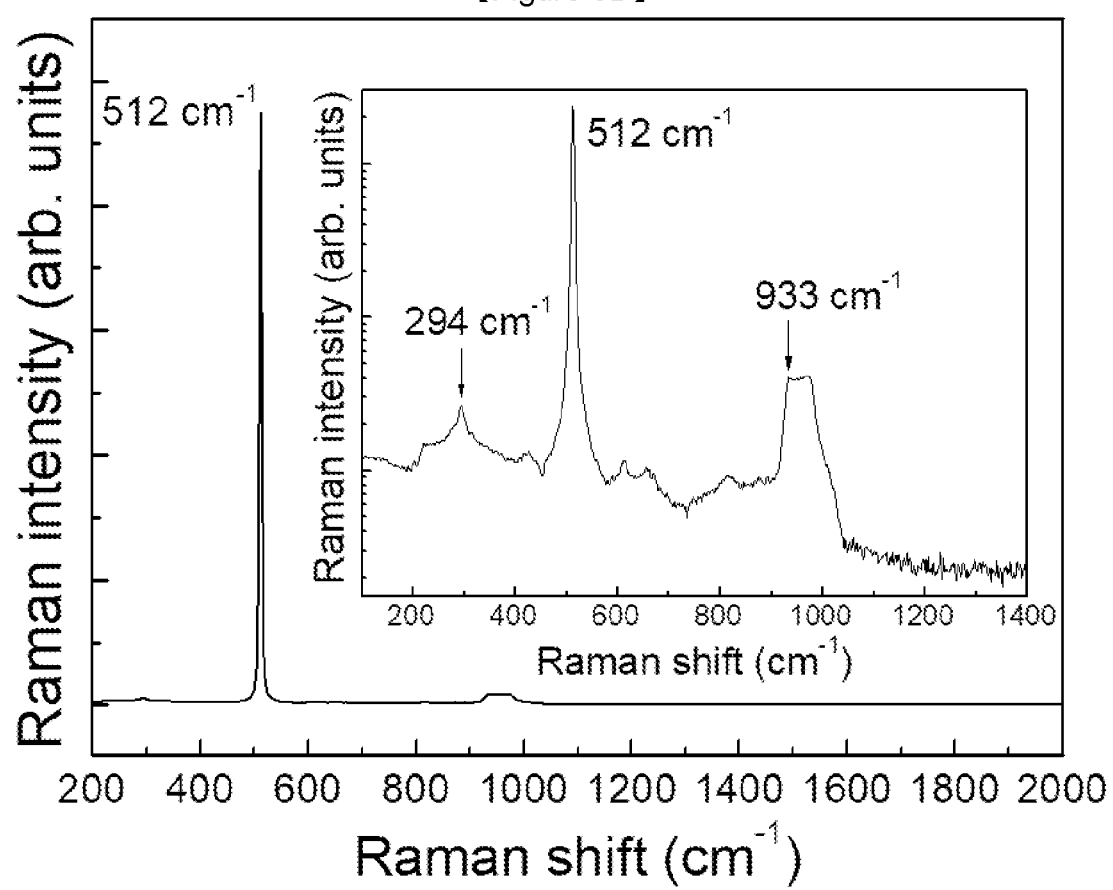
【Figure 8D】

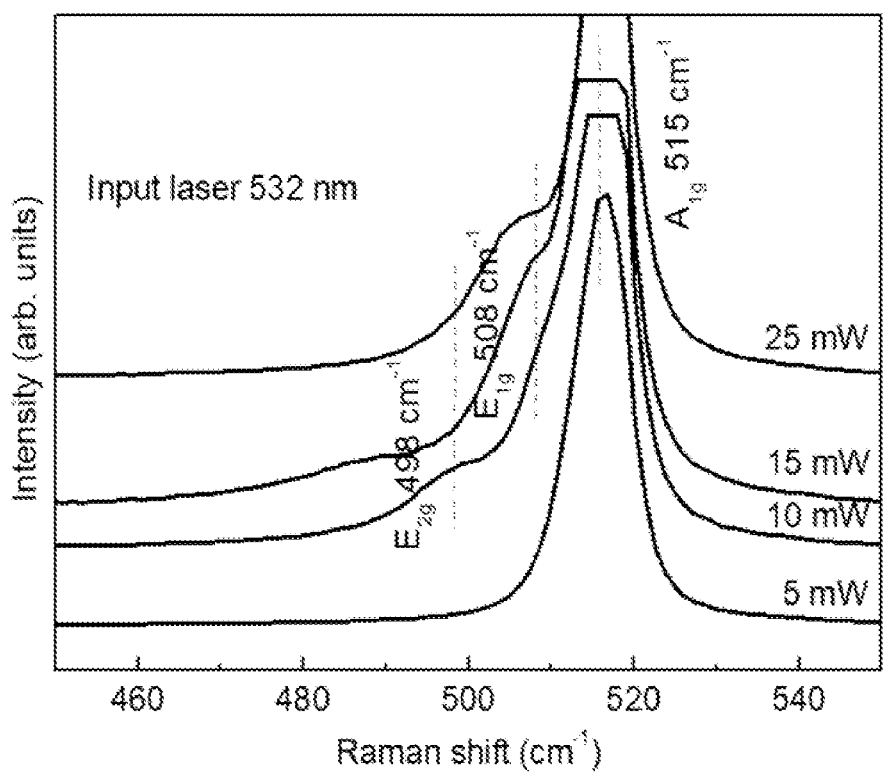
[Figure 8E]

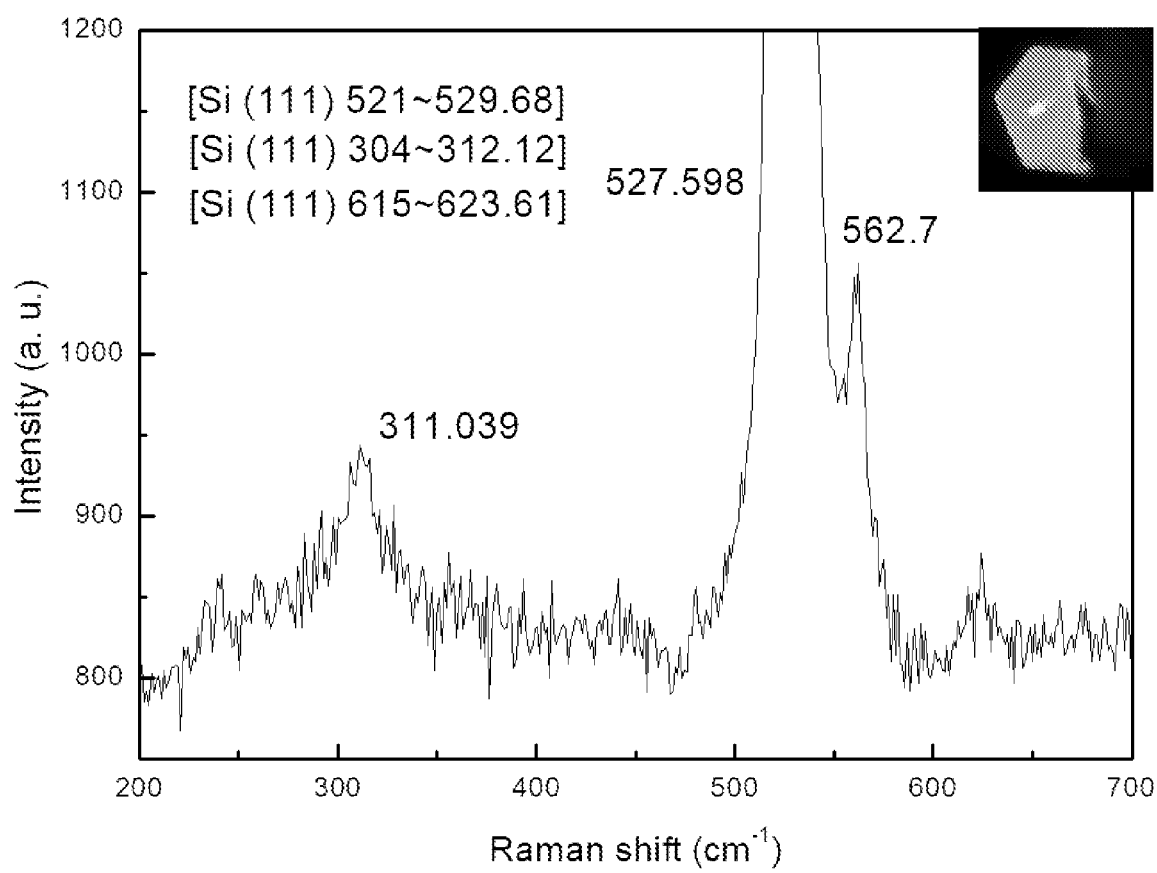

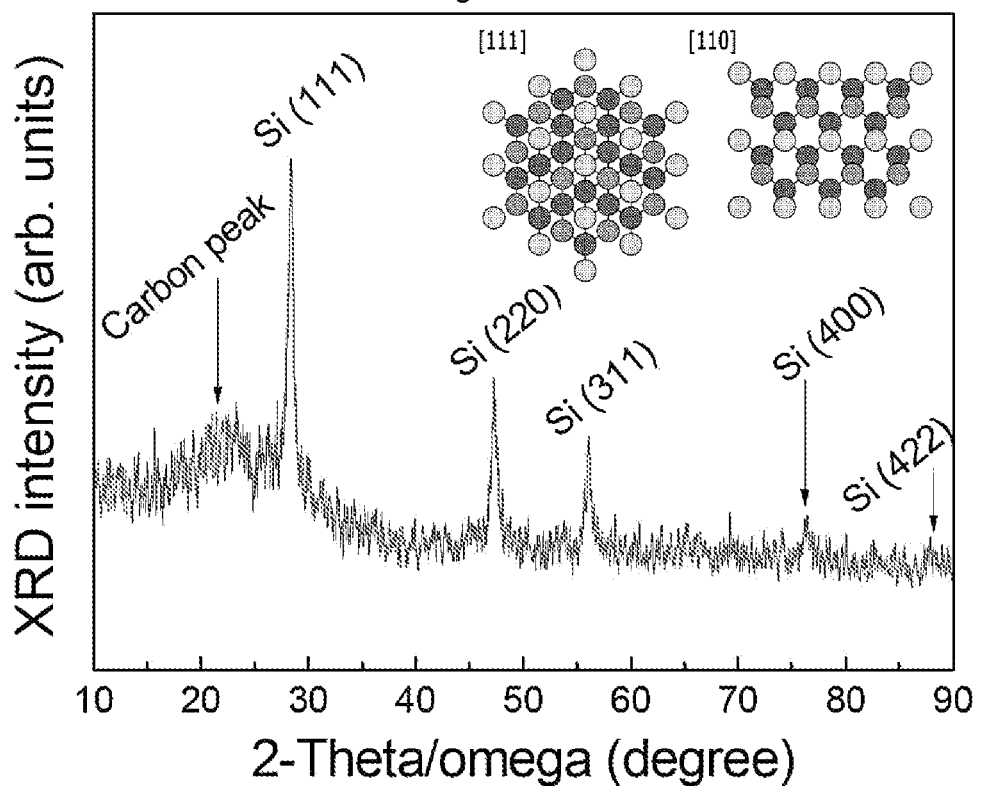
[Figure 9A]
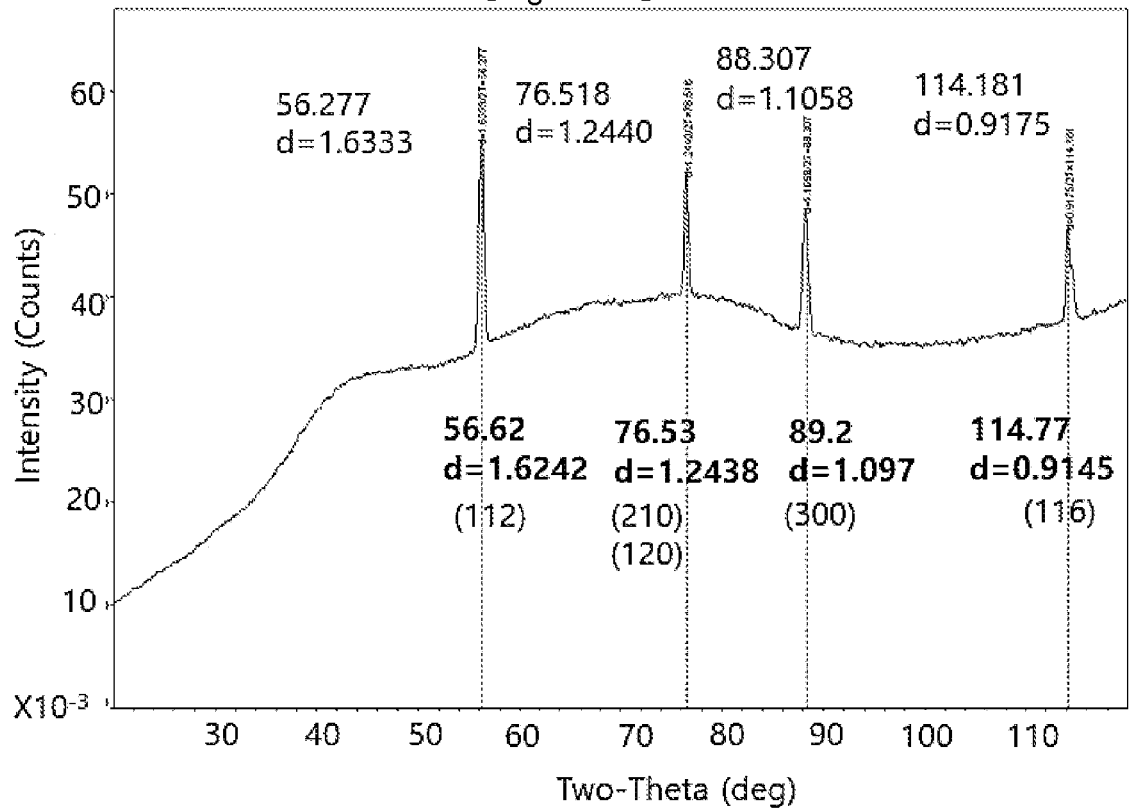
[Figure 9B]

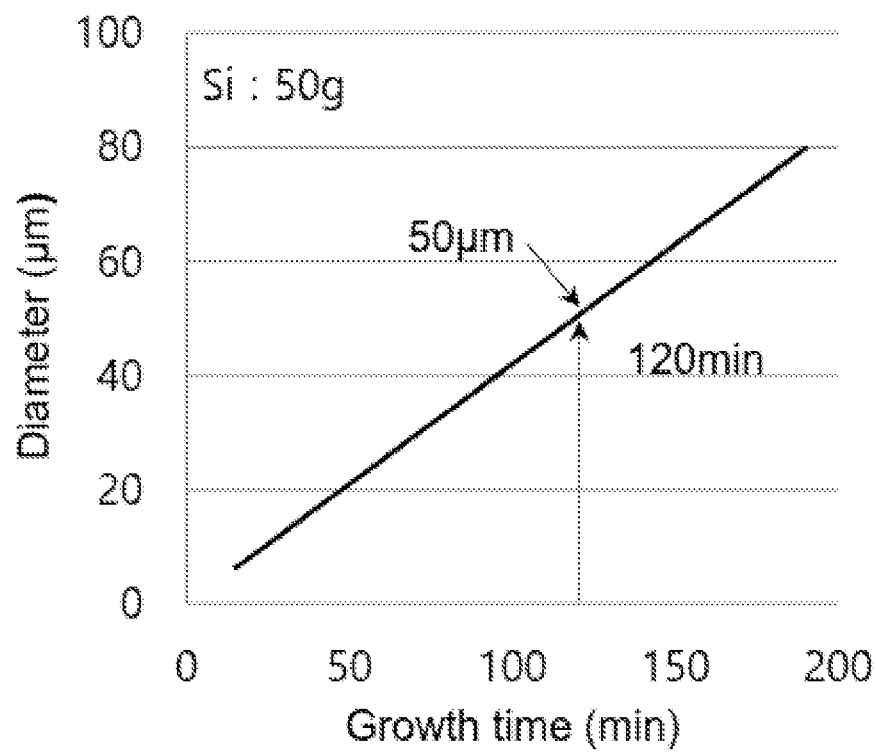
[Figure 10A]
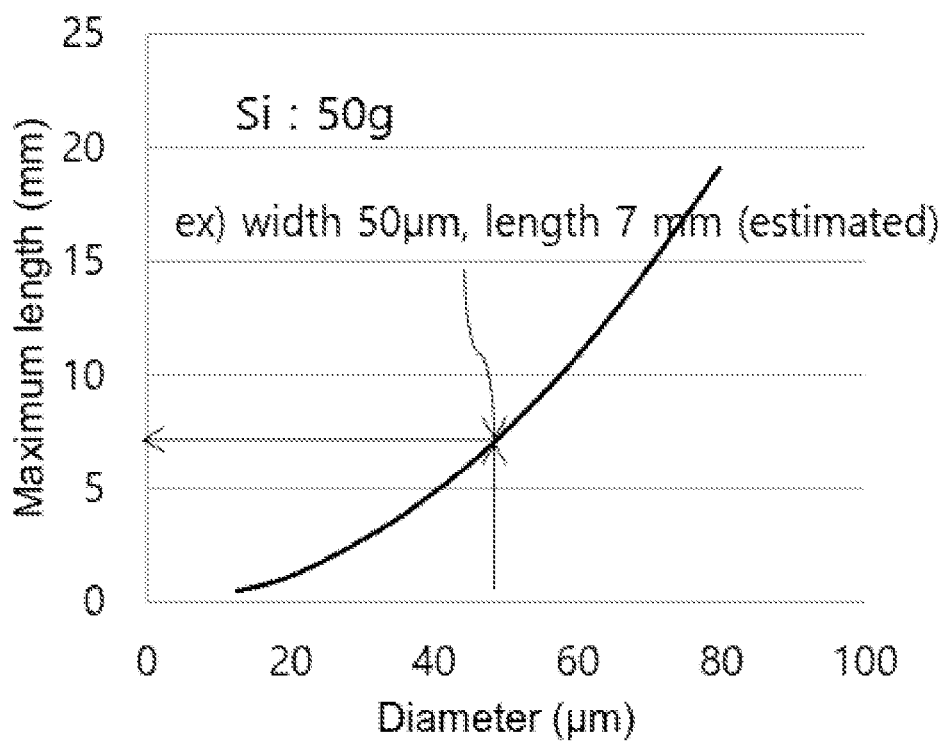
[Figure 10B]

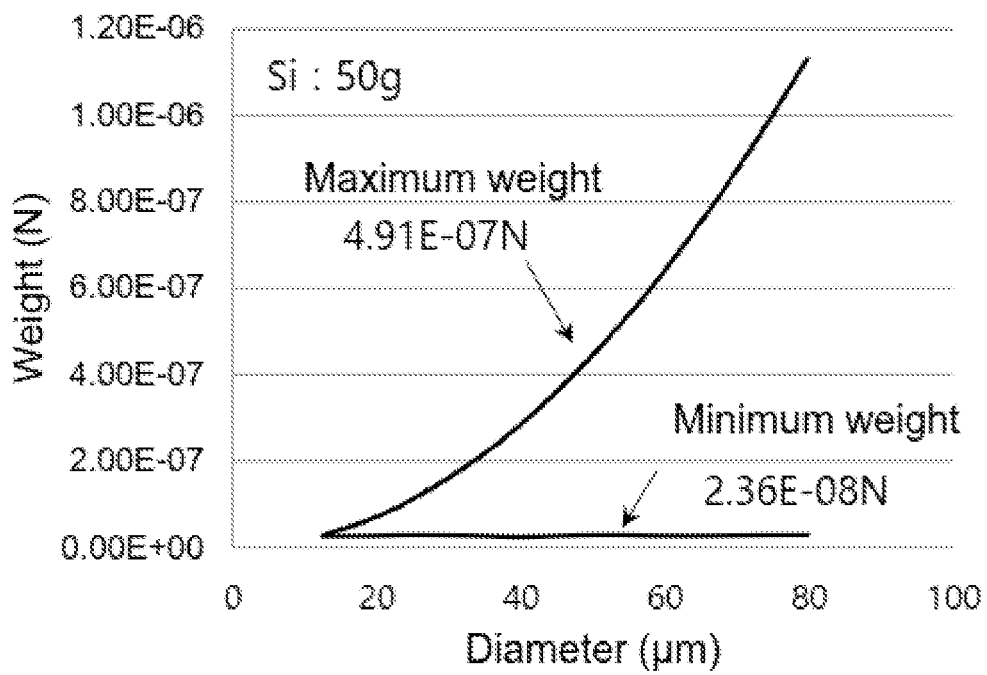
[Figure 10C]
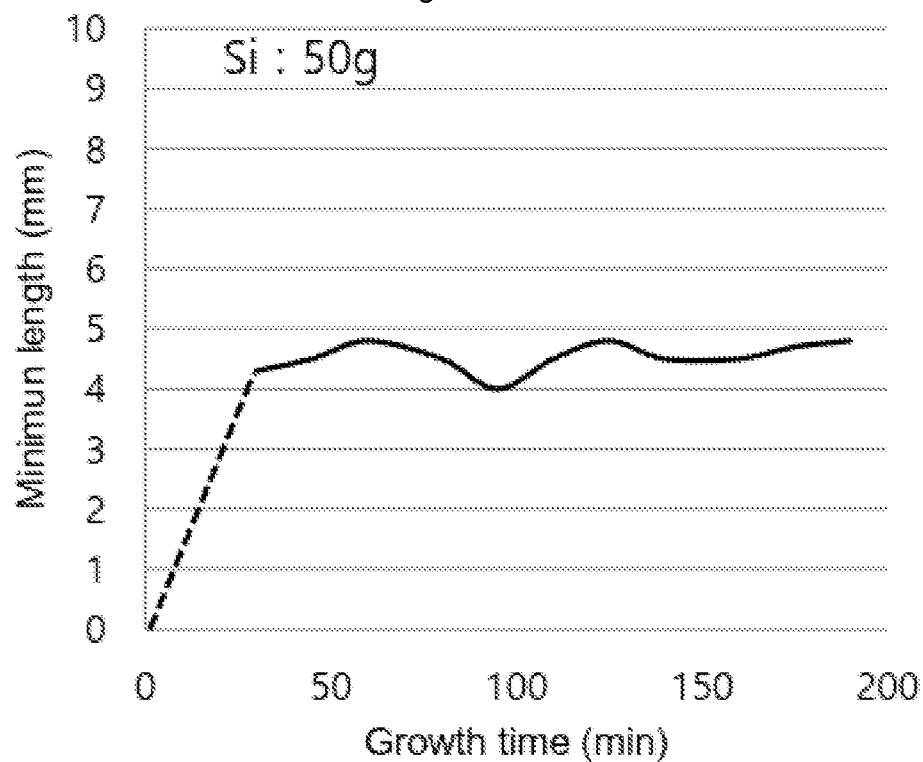
[Figure 10D]

[Figure 11]
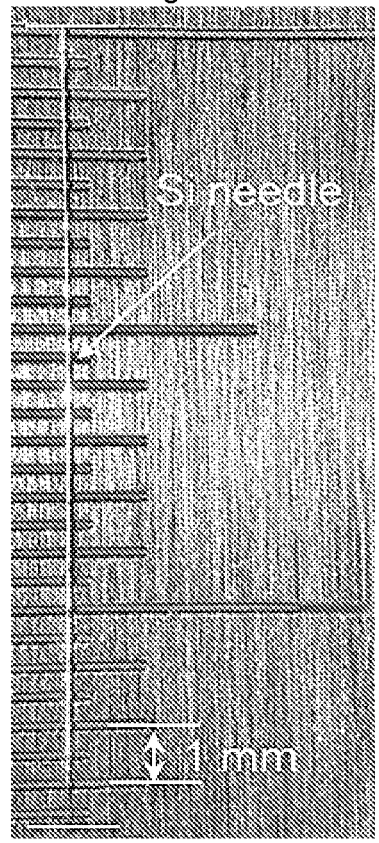
[Figure 12]
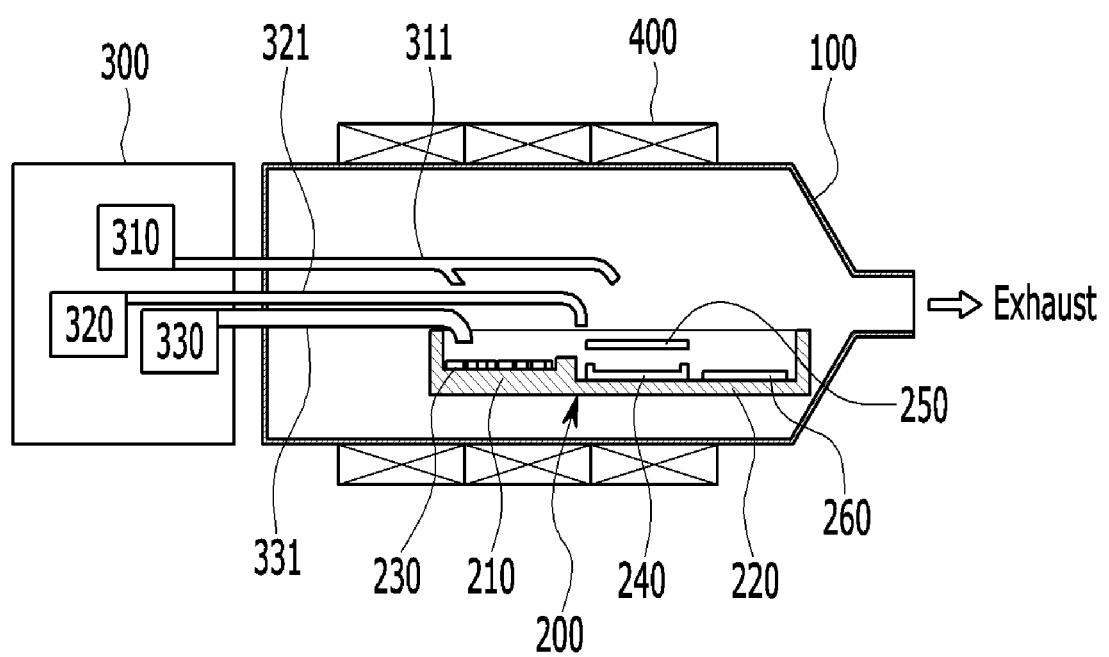

APPARATUS AND METHOD FOR MANUFACTURING HEXAGONAL SILICON CRYSTAL

TECHNICAL FIELD

The present invention relates to an apparatus and a method for manufacturing a hexagonal silicon crystal, and more particularly to an apparatus and a method for manufacturing a hexagonal silicon crystal using a mixed-source hydride vapor phase epitaxy (HVPE) method.

BACKGROUND ART

Diamond is known as one of the hardest materials in the world, but it is challenged by the discovery of the lonsdaleite hexagonal structure. The lonsdaleite structure is an element of the Wurtzite structure with crystallographic symmetry of P63/mmc. Artificial hexagonal diamonds were first synthesized in 1966, and were found from the diamond grains of the Canyon Diablo meteorite.

Although the lonsdaleite structure has been drawing attention for its properties such that it is much harder than ordinary diamonds and it has important potential for industrial applications, studies for forming pure crystals and nanostructures thereof, and theoretical studies, are still insignificant.

Silicon crystals naturally form with a cubic structure. All electronic devices including semiconductors manufactured using silicon are manufactured using cubic crystal structure silicon. However, this cubic Si crystal structure forms an indirect transition semiconductor having an indirect band gap of 1.1 eV and a direct band gap of 3.2 eV, and the gap between the direct bandgap and the indirect bandgap is 2.3 eV. It is an inefficient light absorber because of the large energy difference. Nevertheless, silicon is one of the most abundant elements on earth, and is the most important material in the semiconductor industry, and particularly, is the leading material in the solar cell industry. Therefore, it is necessary to develop a silicon crystal of a new structure with a small energy difference between the direct bandgap and the indirect bandgap.

Silicon has allotropes with different properties at the same temperature and pressure in a single solid. Depending on the growth conditions, crystal structures with different properties can be obtained. One example is a lonsdaleite or hexagonal Si crystal structure. Several researchers have theoretically suggested energy band values and structures of hexagonal Si crystal. This relates to nanostructures of several tens of nm or nanostructures using a hexagonal matrix such as GaP. However, stable crystal structure at room temperature and normal pressure with a large body (mm order of magnitude) has not yet been manufactured.

REFERENCES

[1] S. Q. Wang and H. Q. Ye, "First-principles study on the lonsdaleite phases of C, Si and Ge" J. Phys.: Condens. Matter 15 2003 L197-L202.

[2] B. R. Wu, "First-principles study on the high-pressure behavior of the zone-center modes of lonsdaleite silicon", Phys. Rev. B 61 2000 5.

[3] A. De and C. E. Pryor, "Electronic structure and optical properties of Si, Ge and diamond in the lonsdaleite phase" J. Phys.: Condens. Matter 26, 2014 045801.

[4] H. J. Xiang, B. Huang, E. J. Kan, S.-H. Wei, and X. G. Gong, "Towards direct-gap silicon phases by the inverse band structure design approach" Phys. Rev. Lett. 110 2013 118702.

[5] Q. Q. Wang, B. Xu, J. Sun, H. Y. Liu, Z. S. Zhao, D. L. Yu, C. Z. Fan, and J. L. He, "Direct band gap silicon allotropes" J. Am. Chem. Soc. 136 2014 9826-9829.

[6] S. Botti, J. A. Flores-Livas, M. Amsler, S. Goedecker and M. A. L. Marques, "Low-energy silicon allotropes with strong absorption in the visible for photovoltaic applications" Phys. Rev. B 86 2012 121204.

[7] Q. Fan, C. Chai, Q. Wei, H. Yan, Y. Zhao, Y. Yang, X. Yu, Y. Liu, M. Xing, J. Zhang and R. Yao, "Novel silicon allotropes: Stability, mechanical, and electronic properties" J. Appl. Phys. 118 2015 185704.

[8] H. I. T. Hauge, M. I A. Verheijen, S. Conesa-Boj, T. Etzelstorfer, M. Watzinger, D. Kriegner, I. Zardo, C. Fasolato, F. Capitani, P. Postorino, S. Kolling, A. Li, S. Assali, J. Stangl and E. P. A. M. Bakkers, "Hexagonal Silicon Realized", Nano Lett. 15, 9 2015 5855-5860.

[9] Z. He, J.-L. Maurice, Q. Lia and D. Pribatb, "Direct evidence of 2H hexagonal Si in Si nanowires", Nanoscale 11 2019 4846-4853.

DISCLOSURE

Technical Problem

It is an object of the present invention to provide an apparatus and a method for manufacturing hexagonal Si crystal.

It is another object of the present invention to provide an apparatus and a method for manufacturing hexagonal Si crystal which is large (mm order of magnitude) and stable at room temperature and normal pressure.

It is still another object of the present invention to provide an apparatus and a method for manufacturing hexagonal Si crystal of which a growth ratio is controllable by adjusting the mixing ratio of silicon, aluminum, and gallium of a mixed source, and the diameter, length, and tip shape.

It is still another object of the present invention to provide an apparatus and a method for manufacturing hexagonal Si crystal regardless of face arrangement of a silicon substrate.

It is still another object of the present invention to provide an apparatus and a method for simultaneously manufacturing hexagonal Si crystal as well as aluminum nitride crystal.

Technical Solution

To achieve these and other objects, an aspect of the present invention provides an apparatus for manufacturing hexagonal Si crystal including: a reaction tube; a mixed source part placed on one side in the reaction tube for receiving mixed source of silicon, aluminum, and gallium which are in solid state; a halogenation reaction gas supply pipe for supplying a halogenation reaction gas to the mixed source part; a substrate mounting part placed on the other side in the reaction tube for mounting a first substrate, wherein the first substrate is disposed such that a crystal growth surface of the first substrate faces downwards; a nitrification reaction gas supply pipe for supplying nitrification reaction gas to the substrate mounting part; and a heater for heating the reaction tube. The heater heats the reaction tube in a temperature range of 1100-1300° C.

A mixing ratio of silicon:aluminum:gallium in the mixed source is 1-5:1-5:1, and preferably 1-5:1-5:1.

Silicon in the mixed source is metallurgical grade silicon and the first substrate is a silicon substrate.

In the substrate mounting part, a collecting substrate is spaced vertically from the first substrate and disposed under the first substrate.

In order to simultaneously grow hexagonal Si crystal as well as aluminum nitride, a second substrate is spaced from the first substrate and is disposed such that a crystal growth surface of the second substrate faces upwards. A material of the second substrate is selected from a group including silicon, sapphire, silicon carbide, quartz, and ceramic.

Another aspect of the present invention provides a method for manufacturing hexagonal Si crystal, including the steps of: placing a mixed source of silicon, aluminum, and gallium, which are in solid state, on one side in a reaction tube; placing a first substrate on the other side in the reaction tube, wherein the first substrate is disposed such that a crystal growth surface of the first substrate faces downwards the reaction tube; heating the reaction tube in a temperature range of 1100-1300° C.; supplying a halogenation reaction gas to the mixed source; supplying a nitrification reaction gas to the first substrate; generating trichlorosilane gas and metal chloride gas by reacting the mixed source and the halogenation reaction gas; generating a nucleus on the first substrate by reacting the generated trichlorosilane gas, metal chloride gas, and nitrification reaction gas; and growing hexagonal Si crystal around the generated nucleus. After growing hexagonal Si crystal, a crystal shaped triangular pyramid is grown by decreasing a partial pressure of the trichlorosilane gas.

The hexagonal Si crystal is separated by its own weight from the first substrate when the surface area of the nucleus is more than 20 $\mu m^2$ and its weight is more than $2.0 \times 10^{-8}$ N. The separation step is preferably performed when its weight is more than $2.7 \times 10^{-8}$ N.

The step of placing the first substrate includes placing a collecting substrate spaced vertically from the first substrate and disposed under the first substrate. The hexagonal Si crystal which is separated in the separating step is collected on the collecting substrate.

A second substrate is spaced from the first substrate and disposed such that a crystal growth surface of the second substrate faces upwards, in order to growing aluminum nitride crystal.

A mixing ratio of silicon:aluminum:gallium in the mixed source is: 1-5:1-5:1, and preferably 1-5:1-5:1.

The growth ratio of the hexagonal Si crystal becomes higher as the mixing ratio of silicon in the mixed source is higher, and a length and/or a diameter of the hexagonal Si crystal become greater as the mixing ratio of silicon in the mixed source is higher.

Another aspect of the present invention provides hexagonal Si crystal formed according to the method described above.

Advantageous Effects

According to the present invention, hexagonal Si crystal can be grown in large quantities by a HVPE method using mixed sources of silicon, aluminum, and gallium. This hexagonal Si crystal has a large size (several mm) and a stable hexagonal Si crystal structure at room temperature and atmospheric pressure.

In addition, the present invention can control the silicon crystal growth ratio by adjusting the mixing ratio of silicon, aluminum, and gallium of a mixed source. The diameter, length, and tip shape can also be adjusted according to the crystal growth ratio.

An apparatus for manufacturing hexagonal Si crystal and method according to the present invention can grow hexagonal Si crystal regardless of face arrangement of a silicon substrate.

The present invention further provides simultaneously growth of hexagonal Si crystal as well as aluminum nitride crystal.

Since hexagonal Si crystals grown by the present invention are a pure Si single crystal of a hexagonal shape, it is useful in fields related to the silicon industry such as solar cells and medical fields. Since the difference between the direct bandgap and the indirect bandgap of hexagonal silicon crystal is relatively small, the range of the absorption wavelength of sunlight in the ultraviolet region is widened. Therefore, the efficiency of a solar cell is increased by more than 10% as characteristics of the material. Hexagonal silicon crystal is applicable to a material of a light-emitting device [10]. Moreover, since the thermal conductivity hexagonal silicon is 40% lower than that of general cubic silicon [11], it is very useful in the existing silicon-related industry such as electronic devices and in the field of micro photonics.

REFERENCES

[10] Yaguang Guo, Qian Wang, Yoshiyuki Kawazoe, and Puru Jena, "A New Silicon Phase with Direct Band Gap and Novel Optoelectronic Properties", Scientific Reports, 5, 14342 2015.

[11] Marti Raya-Moreno1, Hugo Aramberri, Juan Antonio, Seijas-Bellido, Xavier Cartoixal, and Riccardo Rurali, "Thermal conductivity of hexagonal Si and hexagonal Si nanowires from first-principles", Appl. Phys. Lett. 111, 032107 2017.

DESCRIPTION OF THE DRAWINGS

FIG. 1 shows an apparatus for manufacturing hexagonal Si crystal according to a first exemplary embodiment of the present invention.

FIG. 2 shows an exemplary reaction boat which can be employed in the present invention.

FIG. 3 shows a schematic view illustrating the growth of hexagonal Si crystal according to the present invention.

FIG. 4 shows a schematic view illustrating the separation of hexagonal Si crystal grown according to the present invention.

FIGS. 5A to 5G are FE-SEM pictures of hexagonal Si crystal grown according to an experimental example of the present invention.

FIGS. 6A and 6B are shows spectrum results of Energy Dispersive X-ray Spectroscopy (EDS) for hexagonal Si crystal and a nucleus grown, respectively, according to the present invention.

FIGS. 7A to 7D illustrate the composition distribution for roots of hexagonal Si crystal.

FIGS. 8A to 8C show spectrum results of EDS, and FIGS. 8D to 8F show Raman spectrum results for hexagonal Si crystal at different positions.

FIGS. 9A and 9B show XRD 2θ/ω scan results for hexagonal Si crystal grown according to the present invention.

FIGS. 10A to 10D are graphs showing relations between size (length, diameter) and weight and growth time for hexagonal Si crystal.

FIG. 11 shows pictures of hexagonal Si crystal grown according to the present invention.

FIG. 12 shows an apparatus for manufacturing hexagonal Si crystal according to a second exemplary embodiment of the present invention.

MODE FOR INVENTION

Preferred embodiments of the present invention will hereinafter be described in detail with reference to the accompanying drawings, where like numerals of reference designate like elements throughout.

FIG. 1 shows an apparatus for manufacturing hexagonal Si crystal according to a first exemplary embodiment of the present invention. The apparatus for manufacturing hexagonal Si crystal according to the present invention employs a HVPE method for growth hexagonal Si crystal. Referring to FIG. 1, the apparatus includes a reaction tube 100, a mixed source part 210 and a substrate mounting part 220 placed in the reaction tube 100, a gas supply 300 for supplying reaction gas to reaction tube 100, and a heater 400 for heating the interior of the reaction tube 100.

The reaction tube 100 is preferably a quartz tube, and the heater 400 is preferably a hot wall furnace configured as a general three-heater furnace, but it is not limited thereto.

The mixed source 230 in which silicon, aluminum, and gallium are mixed is placed in the mixed source part 210. At this time, silicon is a main material for growing hexagonal Si crystal and can be a metallurgical grade silicon. Aluminum acts as a catalyst for nucleation required for growing hexagonal Si crystal. Gallium melts the main material of silicon and then accommodates a reaction with the halogenation reaction gas as described later. Gallium also avoids oxidation of materials and then accommodates easy contact with the halogenation reaction gas. Gallium also acts as a catalyst for nucleation required for growing hexagonal Si crystal on the substrate, together with aluminum.

The mixing ratio of silicon:aluminum:gallium in the mixed source is 1-10:1-5:1, and preferably 1-5:1-5:1.

The substrate mounting part 220 is provided to mount a first substrate 250 on which hexagonal Si crystal grows and a collecting substrate 240 disposed under the first substrate, for collecting hexagonal Si crystal. The first substrate 250 is a silicon substrate and is disposed such that its crystal growth surface faces downwards. Therefore, hexagonal Si crystal grows downwards on first substrate 250. The first substrate 250 can be a Si (111) substrate, a Si (100) substrate etc., independent from a surface direction.

The collecting substrate 240 collects hexagonal Si crystal from the first substrate 250 when the hexagonal Si crystal falls downwards by its own weight.

Therefore, the collecting substrate 240 is spaced vertically from the first substrate 250 and disposed under the first substrate 250. The collecting substrate 240 may be employed as a flat panel, and may alternatively have a tray shape having a side guide, as shown in FIG. 2. The collecting substrate 240 may be a substrate selected from a group including silicon, sapphire, silicon carbide, quartz, and ceramic. The gap between the first substrate 250 and the collecting substrate 240 can be adjusted according to a preferred growth length of the hexagonal Si crystal. For example, when the desired growth length is 5 mm, the distance between the first substrate 250 and the collection substrate 240 may be 5 mm or more. For the purpose of explanation, a holding mechanism is omitted in FIG. 1 and FIG. 2, but a suitable holding mechanism is employed for holding the first substrate 250.

The gas supply 300 includes an atmosphere gas supply 310 for supplying atmosphere gas such as nitrogen, a nitrification reaction gas supply 320 for supplying nitrification reaction gas such as ammonia ($NH_3$), and a halogenation reaction gas supply 330 for supplying halogenation reaction gas such as hydrogen chloride (HCl). The gas supplies 310, 320, and 330 supply gases to the reaction tube 100 via pipes 311, 321, and 331, respectively.

The atmosphere gas supply 310 provides atmospheric gas, e.g., nitrogen, to both of the mixed source part 210 and the substrate mounting part 220 via the pipe 311, to form nitrogen an atmospheric environment in the reaction tube 100 and the reaction boat 200. The atmospheric gas carries trichlorosilane gas and metal chloride gas ($AlCl_n$, $GaCl_n$) generated by reaction of the mixed source and a halogenation reaction gas to the substrate mounting part 220. The atmospheric gas further maintains stable gas flow in the reaction tube 100.

The halogenation reaction gas is directly blown to the mixed source disposed on the mixed source part 210 via the pipe 331 connected to the halogenation reaction gas supply 330, and accommodates generating trichlorosilane and metal chloride gas ($AlCl_n$, $GaCl_n$).

The pipe 321 connected to the nitrification reaction gas supply 320 provides the substrate mounting part 220 with the nitrification reaction gas.

Therefore, an outlet of the pipe 321 is preferably disposed around the substrate mounting part 220.

FIG. 2 shows an exemplary reaction boat 200 in which the mixed source part 210 and the substrate mounting part 220 are integrated according to the exemplary embodiment of FIG. 1. The reaction boat 200 has a mixed source part 210 and a substrate mounting part 220. A mixed source of silicon, aluminum, and gallium is disposed on the mixed source part 210. The substrate mounting part 220 holds a first substrate 250 and a collecting substrate 240.

A method for manufacturing hexagonal Si crystal using the apparatus according to the present invention will now be described.

First, silicon, aluminum, and gallium which are solid are mixed and disposed on the mixed source part 210. The mixing ratio of silicon:aluminum:gallium in the mixed source is 1-10:1-5:1, and preferably 1-5:1-5:1.

The first substrate 250 and the collecting substrate 240 are mounted on the upper and lower sides of the substrate mounting part 220, respectively.

Next, the heater 400 is operated to heat the reaction tube 100 to 1100-1300° C. At this time, an atmospheric gas of nitrogen is provided to flow and a nitrification reaction gas of ammonia is provided to flow a certain amount to the substrate mounting part 220 before heating to raise the temperature of the reaction boat 200. The pipe 321 for supplying the nitrification reaction gas is formed of a quartz tube, and provides the nitrification reaction gas to the substrate mounting part 220.

Next, the temperature of the reaction tube 100 becomes stable and then a halogenation reaction gas of hydrogen chloride is provided to the mixed source part 210. The hydrogen chloride reacts with each of silicon, aluminum, and gallium of the mixed source. The silicon reacts with hydrogen chloride to generate trichlorosilane (Si+3HCl→$SiHCl_3$+$H_2$), the aluminum reacts with hydrogen chloride to generate AlCl, and the gallium reacts with hydrogen chloride to generate $GaCl_n$ (n=1, 2, 3 . . . ).

At this time, gallium disperses the surfaces of aluminum and silicon in the mixed source and mostly removes the oxidized layer and the nitrified layer of the surfaces of aluminum and silicon. That is, silicon and aluminum are oxidized and nitrified in a high temperature atmosphere, but a small amount of gallium disperses from their surfaces and removes the oxidized layer and the nitrified layer to activate while raising the temperature. Therefore, gallium activates aluminum to accommodate reactions between aluminum and hydrogen chloride to generate AlCl. Gallium further suppresses generation of an oxidized layer and a nitrified layer on the surface of silicon, and accommodates reactions between silicon and hydrogen chloride to generate trichlorosilane ($SiHCl_3$). If gallium is not mixed into the mixed source, it is difficult for the mixed source to react with hydrogen chloride due to a oxidized layer and a nitrified layer on the surface of silicon.

Next, $SiHCl_3$, AlCl, and $GaCl_n$ gases, which are generated from reactions between the mixed source and hydrogen chloride, react with ammonia of the nitrification reaction gas at the first substrate 250 in the substrate mounting part 220 and then form nuclei for the hexagonal Si crystal on the surface of the first substrate 250.

When nuclei for hexagonal Si crystal is formed, adatoms grow. At early growth, Si nuclei include Al and N due to introduced AlCl gas. The Si nuclei is in amorphous state at early growth. Since gallium in the mixed source removes an oxidized layer and a nitrified layer on the surface of aluminum as described above, aluminum can react with HCl to obtain a relatively high partial pressure of AlCl gas which enables Si nuclei including Al and N to be formed.

First, gallium in the mixed source is rapidly consumed at the nucleation step, and then gallium at the aluminum surface is completely exhausted to decrease the supplying quantity of aluminum. After gallium, which melts silicon, is completely exhausted, gas originated from silicon is rapidly supplied. Trichlorosilane is provided to the substrate mounting part 220 at the high partial pressure to grow hexagonal Si crystal in a main growth mode.

Later, as the silicon source is consumed, the partial pressure of trichlorosilane is rapidly decreased to growth silicon crystal in the shape of a triangular pyramid. It seems that the decrease of the partial pressure of trichlorosilane tends to grow cubic silicon crystal (111), (−111), (11−1), and (1−11), which is a natural structure, rather than hexagonal silicon crystal. However, since hexagonal silicon crystal already forms a matrix, it seems that the direction of the stacking fault acts to reduce the three sides of the hexagon, resulting in deformation. When the temperature of the heater 400 is lowered after a predetermined growth time has elapsed, the temperature is lowered to grow crystal in the shape of a sharp triangular pyramid tip and the growth is completed. This shape of triangular pyramid can be converted to a rhombohedral structure or a trigonal structure.

FIG. 3 shows a schematic view illustrating growth of hexagonal Si crystal.

Step (a) shows a process for forming nuclei, in which $SiHCl_3$, AlCl, and $GaCl_n$ gases react with ammonia gas, and gallium and aluminum adhere to a silicon substrate, and then silicon is parasitized to form nuclei mostly made of silicon. Then, as the reaction continues as shown in step (b), parasitic Si containing Al and N grows in an amorphous form, and hexagonal Si begins to grow regardless of the direction of the substrate in the range of 20-100 $\mu m^2$ with a surface area. Step (c) shows that silicon crystal grows. At this time, due to the high partial pressure of $SiHCl_3$, Si selects the hexagonal structure which is the most stable structure, and hexagonal Si crystal grows. Silicon, whose structure is selected as a hexagonal crystal, rapidly grows to a hexagonal crystal structure with a diameter of several tens of $\mu m$ and a length of several mm. Afterwards, step (d) shows that crystal growth is completed to a structure like a triangular pyramid from a hexagonal structure, as $SiHCl_3$ is consumed. This shape of triangular pyramid can be converted to a rhombohedral structure or a trigonal structure.

Meanwhile, the hexagonal silicon crystals grow in a shape suspended upside down from the first substrate 250. When they reach a predetermined weight, they are separated from the first substrate 250 by their own weight, and collected on the collection substrate 240. The crystal begins to separate when the surface area of the nucleus of the hexagonal Si crystal is 20 $\mu m^2$ or more, and the weight is $2.0 \times 10^{-8}$ N or more, preferably $2.7 \times 10^{-8}$ N-$3.0 \times 10^{-8}$ N or more. The length to which is converted from the initial separation weight of the hexagonal Si crystal is approximately 2 mm.

Constants for converting between weight and length are based on Table 1.

TABLE 1

| Si (FFC) | |
|---|---|
| Lattice constant a | $5.43 \times 10^{-10}$ m |
| Unit volume (diamond structure) | $1.60103 \times 10^{-28}$ $m^3$ |
| Mass of Si atom | $4.66 \times 10^{-26}$ kg |
| Number of atoms per unit structure | 8 |
| Unit mass | $3.73 \times 10^{-25}$ kg |
| DIAMETER | 0.00003 m |

FIG. 4 shows a schematic view illustrating that hexagonal Si crystal grows and separates. It is started with step (a), and nuclei are formed at steps (b) and (c). Hexagonal Si crystals grow in steps (d)-(e), and the crystals begin to separate at step (g) and are collected on the collecting substrate at step (g). Sections (1) to (4) of FIG. 4 show the process of steps (a)-(d) by magnifying a single hexagonal Si crystal. After the growth is completed, the hexagonal Si crystal is separated from the first substrate 250 by its own weight according to the present invention, but is not limited thereto. For example, it is possible to forcibly separate hexagonal Si crystals after growing to a predetermined length by setting a suitable growth time.

Table 2 shows growth conditions for hexagonal Si crystals and experimental data according to an exemplary embodiment of the present invention.

TABLE 2

| | Conditions | Experiments |
|---|---|---|
| Reaction tube temperature | 1100-1300° C. | 1150° C. |
| First substrate | Si 111, Si 100 | Si 111 |
| Collecting substrate | Si 111, sapphire, quartz, ceramic | Si 111 |
| Hydrogen chloride | 50-120 sccm | 100 sccm |
| Growth time | 1-5 hours | 2 hours |
| Si amount of the mixed source | 10-100 g | 10 g or more |
| Al amount of the mixed source | 10 g or less | 10 g or less |
| Ga amount of the mixed source | 10 g or less | 10 g or less |
| Growth ratio | 1.0-4.0 mm/h | 3.8 mm/h |
| Ammonia | 1000-5000 sccm | 1000 sccm |
| Nitrogen | 1000-5000 sccm | 5000 sccm |

Growth conditions of hexagonal Si crystals of Table 2 and results will now be described. Hydrogen chloride, ammonia, and nitrogen gases were uniformly provided at 100 sccm, 1000 sccm, and 5000 sccm, respectively. Growth temperature and growth time were set to 1150° C. and 2 hours, respectively. Maximum growth ratio of hexagonal Si crystals was 3.8 mm/h, and hexagonal Si crystals grew to a 7 mm length or more. The mixed source was Si 10 g, Al 10 g, and Ga 10 g. Table 3 shows characteristics of hexagonal Si crystals as obtained.

TABLE 3

| Shape | Hexagonal column having a tip of triangular pyramid |
|---|---|
| Tip | 500 nm or less |
| Root | 10 μm or less |
| Diameter | 20-50 μm |
| Length | 1-10 mm |
| Composition | 100% Si |

FIGS. 5A to 5G are FE-SEM pictures of hexagonal Si crystal grown according to an experimental example of the present invention. FIG. 5A shows a hexagonal Si crystal separated which has a shape of a needle. FIG. 5B shows the surface of the first substrate 250 after separation of hexagonal Si crystal, and FIG. 5C is an enlarged view of FIG. 5B. FIG. 5D shows an enlarged middle portion of the hexagonal Si crystal shown in FIG. 5A, showing that the diameter is 20 μm. FIG. 5E shows an enlarged tip portion of the hexagonal Si crystal shown in FIG. 5A, showing the shape of triangular pyramid. FIG. shows a further enlarged view, confirming the tip of 130 nm. FIG. 5G shows the root of the hexagonal Si crystal having a diameter of 5 μm which matches the size of the nucleus of FIG. 5C.

FIGS. 6A and 6B are shows spectrum results of Energy Dispersive X-ray Spectroscopy (EDS) for the hexagonal Si crystal and nucleus, respectively, grown according to the present invention. Hexagonal Si crystal contains Al of 0.5 At % and Si of 99.5 At %, while the nucleus contains a greater Al ratio than that of the hexagonal Si crystal. Both cases indicate that any other peak such as 0 or N is not observed.

FIGS. 7A to 7D illustrate the composition distribution for a root of hexagonal Si crystal. First, FIG. 7A shows amorphous state (round shape) of Si. For reference, the inventors could not grow hexagonal Si crystals without Al as a source material. FIGS. 7B to 7D show results of determined composition distribution of a root of the hexagonal Si crystal by EDS mapping. FIGS. 7B, 7C, and 7D show AlK composition, NK composition, and SiK composition, respectively. FIG. 7D shows that the Si composition distribution is very high and uniform. FIGS. 7B and 7C show that the Al composition and N composition appear higher toward the bottom of the root (toward the substrate), respectively. Accordingly, it is confirmed that Al contributes nucleation.

FIGS. 8A to 8C show spectrum results of EDS, and FIGS. 8D to 8F show Raman spectrum results, for hexagonal Si crystal at different positions.

FIGS. 8A to 8C show EDS spectra around a root, and a middle portion and a tip (red crosses) of a hexagonal Si crystal having a length of 2.7 mm, respectively. All the spectra confirm that the portions contain Si at 100 At %.

FIGS. 8D to 8F show Raman spectrum results for a hexagonal Si crystal, representing the changes of the structural characteristics. Raman spectrum results were determined at room temperature (300° K) by 532 nm laser DXR™ 2 SmartRaman Spectrometer of Thermo Fisher Scientific.

Referring to FIG. 8D, the strongest Raman peak is observed at 512 cm$^{-1}$, and other peaks are also observed at 294 cm$^{-1}$ and 933 cm$^{-1}$ as shown in the interior graph. Referring to FIG. 8E, main Raman peaks are observed at 515 cm$^{-1}$, 508 cm$^{-1}$, and 498 cm$^{-1}$.

A main Raman peak for a cubic Si single crystal positions at 520 cm$^{-1}$, a Raman peak for Si nanowire positions at the 518 cm$^{-1}$ position, and a clear Raman peak for amorphous Si positions at 480 cm$^{-1}$ are obtained. Therefore, the hexagonal Si crystal according to the present invention has Raman peaks of pure Si crystal different from those of a cubic Si single crystal, Si nanowire, or amorphous Si.

Raman peaks at 515 cm$^{-1}$, 508 cm$^{-1}$, and 498 cm$^{-1}$ shown in FIG. 8E are known as phonon modes of a hexagonal Si crystal by phonon vibrations, as well as a Raman peak at 512 cm$^{-1}$ shown in FIG. 8D. Particularly, Raman peaks of the interior graph of FIG. 8D match those of 30 nm or 60 nm Si nanowire at a log scale. This means that the hexagonal Si crystal according to the present invention is pure silicon that does not contain any other materials.

FIG. 8F shows Raman peaks at a cross-section of hexagonal Si crystal which has positions at 562.7 cm$^{-1}$ which is also a primary Raman peak which can confirms a hexagonal Si crystal.

The references to Raman peaks are in following documents [12]-[15].

[12] S. Piscanec, M. Cantoro, A. C. Ferrari, J. A. Zapien, Y. Lifshitz, S. T. Lee, S. Hofmann and J. Robertson, Phys. Rev. B 68, 241312R 2003.

[13] M. Khorasaninejad, J. Walia and S. S. Saini, Nanotechnology, 23, 275706 2012.

[14] M. Luyao, L. Sudarat, D. Joshua and M. Stephen, RSC Adv. 6, 78818 2016.

[15] Bennett E. Smith, Xuezhe Zhou, Paden B. Roder, Evan H. Abramson, and Peter J. Pauzauskie, "Recovery of hexagonal Si-IV nanowires from extreme GPa pressure" JOURNAL OF APPLIED PHYSICS 119, 185902 2016.

FIGS. 9A and 9B show XRD 2θ/ω scan results for hexagonal Si crystal grown according to the present invention.

FIG. 9A shows XRD 2θ/ω scan results of a sample in which hexagonal Si crystal is randomly extracted and attached to a carbon tape. The XRD 2θ/ω scan results of 2θ are measured at a range from 10° to 90°, using a high resolution X-ray diffraction HR-XRD analysis apparatus of Rigaku's Smartlab. Peaks 2θ=28.37°, 47.28°, 56.12°, 76.26°, and 87.85° are observed except for a carbon tape peak and match Si(111), Si(220), Si(311), Si(400), and Si(422), respectively. The interior drawing shows an atomic structure in which an atom Si has a radius of 1.10 Å. A distance between faces for Si(111) is determined as 2θ=28.44°.

All peaks for Si(220), Si(311), Si(400), and Si(422) relate to peaks Si(111) direction of a hexagonal structure or a triangular pyramid shape. This means that the hexagonal Si crystal according to the present invention is pure silicon, as is in Raman spectra of FIG. 8D.

FIG. 9B shows results determined by a three-dimensional X-ray detecting method and shows that peaks for faces (112) and (210), or faces (120), (300), and (116), completely match those of hexagonal Si JCPDS(ICDD) 76936 (the world's biggest XRD database), confirming hexagonal Si crystal growth. As a result of analyzing the results determined by the X-ray detecting method, the lattice constants a0=0.3811 nm, c0=0.6227 nm, and c0/a0=1.6341 are obtained for the hexagonal structure. These results confirm that hexagonal Si crystal according to the present invention belongs to the 46 h space group of a stacking array of ABABABAB, having a direct transition energy band (direct band gap of 1.69 eV at the Γ-point).

FIGS. 10A to 10D are graphs showing relations between size (length and diameter), and weight and growth time, for hexagonal Si crystal. FIG. 10A is a simulated graph for a diameter at a certain growth time, showing relations between growth time and diameter, when the amounts of silicon, aluminum, and gallium are 50 g, 10 g, and 10 g of the mixed source, respectively. For example, if growth time is 120 min, a diameter is then 50 μm.

FIG. 10B is a simulated graph for a maximum length having a predetermined diameter. For example, if a diameter is 50 μm, a maximum length is expected to become 7 mm. FIG. 11 is a picture showing that hexagonal Si crystal grown according to the present invention has a length of around 13 mm.

FIG. 10O is a simulated graph for a maximum weight having a predetermined diameter. The separation weight is about $2.0 \times 10^{-8}$ N, preferably $2.7 \times 10^{-8}$ N-$3.0 \times 10^{-8}$ N. For example, when a diameter is 50 μm, hexagonal silicon crystals may exist together, having various lengths from a minimum length of 4 mm-5 mm to a maximum length of 7 mm or more. For example, hexagonal silicon crystal having a diameter of 50 μm and a length of 7 mm has a weight of $4.91 \times 10^{-7}$ N, and is separated at 4.5 mm by its own weight. Alternatively, when the surface area of the nucleus is 100 μm² (10 μm×10 μm) or more, which is more than minimum value of 20 μm² (5 μm×5 μm), the sticking force is increased so as to separate at a length of 7 mm or more by its own weight.

FIG. 10D is a simulated graph for growth time and minimum length. FIG. 10D shows that, after 25 min of growth time, hexagonal silicon crystal grows with a length between 2 mm and 20 mm.

Referring next to FIG. 12, an apparatus for manufacturing hexagonal Si crystal according to a second exemplary embodiment of the present invention will be described.

The apparatus for manufacturing hexagonal Si crystal according to a second exemplary embodiment of the present invention is similar to the first exemplary embodiment, but further has a second substrate 260 mounted in a substrate mounting part 220 for AlN crystal growth. The second substrate 260 is spaced from the first substrate 150 and is disposed such that its crystal growth surface faces upwards. The material of the second substrate 260 is selected from a group including silicon, sapphire, silicon carbide, quartz, and ceramic.

A method using the apparatus for manufacturing hexagonal Si crystal according to a second exemplary embodiment of the present invention will now be described.

Similar to the first exemplary embodiment, silicon, aluminum, and gallium which are solid are mixed and disposed on the mixed source part 210. At the substrate mounting part 220, a first substrate 250, a collecting substrate 240, and the second substrate 260 are mounted.

Next, the heater 400 is operated to heat the reaction tube 100 at 1100-1300° C. At this time, atmosphere gas of nitrogen is provided to flow and nitrification reaction gas of ammonia is provided to flow a certain amount to the substrate mounting part 220 before heating to raise the temperature of the reaction boat 200. The pipe 321 for supplying nitrification reaction gas is formed of a quartz tube, and provides nitrification reaction gas to the substrate mounting part 220.

Next, the temperature of the reaction tube 100 becomes stable and then halogenation reaction gas of hydrogen chloride is provided to the mixed source part 210. Hydrogen chloride reacts with each of silicon, aluminum, and gallium of the mixed source to generate trichlorosilane, AlCl, and $GaCl_n$, respectively. The trichlorosilane, AlCl, and $GaCl_n$ gases react with nitrification reaction gas of ammonia at the first substrate 250 of the substrate mounting part 220 to form nuclei for hexagonal Si crystal on the surface of the substrate 250, and also form nuclei for AlN on the second substrate 260, similarly with the first substrate 250.

Afterwards, hexagonal Si crystal grow on first substrate 250, while AlN crystals grow on the second substrate 260 by the reaction between metal chloride gas and ammonia gas. Although it is not shown in the drawing, it is possible to branch a pipe 321 for providing nitrification reaction gas to the first substrate 250 and the second substrate 260. When one branched pipe to the second substrate 260 supplies more ammonia gas, the ammonia gas may contribute minimal nucleation for hexagonal Si crystal at the first substrate 250, and mostly contribute to growth of AlN crystal.

As discussed above, according to the present invention, hexagonal Si crystal can be grown in large quantities by the HVPE method using mixed sources of silicon, aluminum, and gallium. This hexagonal Si crystal has a large size (several mm) and a stable hexagonal Si crystal structure at room temperature and atmospheric pressure.

In addition, the present invention can control the silicon crystal growth ratio by adjusting the mixing ratio of silicon, aluminum, and gallium of a mixed source. The diameter, length, and tip shape can also be adjusted according to the crystal growth ratio.

An apparatus for manufacturing hexagonal Si crystal and method according to the present invention can grow hexagonal Si crystal regardless of face arrangement of a silicon substrate.

The present invention further provides simultaneously growth of hexagonal Si crystal as well as aluminum nitride crystal.

Since hexagonal Si crystals grown by the present invention are pure Si single crystals of a hexagonal shape, they are useful in fields related to the silicon industry such as solar cells and medical fields. Further, the difference between direct bandgap and indirect bandgap is relatively small, so it is very useful in the field of micro photonics.

In addition, the hexagonal silicon crystal grown by the present invention can be utilized as a seed for producing hexagonal silicon crystals having large areas. It is useful to obtain silicon crystals having a rhombohedral structure or a trigonal structure having semi-metal characteristics, and simultaneously, by cutting a transition portion from a hexagonal structure to a triangular pyramid shape.

While this invention has been described in connection with what is presently considered to be practical exemplary embodiments, an ordinarily skilled person in the art can make various changes and modifications within the spirit and scope of the present invention.

The invention claimed is:

1. An apparatus for manufacturing hexagonal Si crystal, comprising:
   a reaction tube;
   a mixed source part placed on one side in the reaction tube, for receiving mixed source of silicon, aluminum, and gallium which are in a solid state;

a halogenation reaction gas supply pipe for supplying a halogenation reaction gas to the mixed source part;

a substrate mounting part placed on the other side in the reaction tube, for mounting a first substrate, wherein the first substrate is disposed such that a crystal growth surface of the first substrate faces downwards;

a nitrification reaction gas supply pipe for supplying a nitrification reaction gas to the substrate mounting part; and a heater for heating the reaction tube, wherein the heater heats the reaction tube in a temperature range of 1100-1300° C., and wherein a collecting substrate is spaced vertically from the first substrate and disposed under the first substrate in the substrate mounting part.

2. The apparatus of claim 1, wherein a mixing ratio of silicon:aluminum:gallium in the mixed source is 1-10:1-5:1.

3. The apparatus of claim 2, wherein a mixing ratio of silicon:aluminum:gallium in the mixed source is: 1-5:1-5:1.

4. The apparatus of claim 1, wherein silicon in the mixed source is metallurgical grade silicon.

5. The apparatus of claim 1, wherein the first substrate is a silicon substrate.

6. The apparatus of claim 1, wherein a second substrate is spaced from the first substrate and is disposed such that a crystal growth surface of the second substrate faces upwards.

7. The apparatus of claim 6, wherein a material of the second substrate is selected from a group comprising silicon, sapphire, silicon carbide, quartz, and ceramic.

8. A method for manufacturing hexagonal Si crystal, comprising the steps of:

placing mixed source of silicon, aluminum, and gallium which are in a solid state, on one side in a reaction tube;

placing a first substrate on the other side in the reaction tube, wherein the first substrate is disposed such that a crystal growth surface of the first substrate faces downwards in the reaction tube;

heating the reaction tube in a temperature range of 1100-1300° C.;

supplying a halogenation reaction gas to the mixed source;

supplying a nitrification reaction gas to the first substrate;

generating trichlorosilane gas and metal chloride gas by reacting the mixed source and the halogenation reaction gas;

generating a nucleus on the first substrate by reacting the generated trichlorosilane gas, metal chloride gas, and nitrification reaction gas; and growing hexagonal Si crystal around the generated nucleus.

9. The method of claim 8, comprising the step of, after growing hexagonal Si crystal, growing crystal in the shape of triangular pyramid by decreasing partial pressure of the trichlorosilane gas.

10. The method of claim 8, comprising separating the hexagonal Si crystal from the first substrate when a weight of the hexagonal Si crystal is more than $2.0 \times 10-8$ N.

11. The method of claim 10, wherein the separating step is performed when weight of the hexagonal Si crystal is more than $2.7 \times 10-8$ N.

12. The method of claim 10, wherein the separating step is performed when a surface area of the nucleus is more than 20 μm2.

13. The method of claim 8, wherein the step of placing the first substrate comprises placing a collecting substrate spaced vertically from the first substrate and disposed under the first substrate, and the method further comprising the step of collecting the hexagonal Si crystal which is separated in the separating step on the collecting substrate.

14. The method of claim 8, wherein the step of placing the first substrate comprises placing a second substrate spaced from the first substrate and disposed such that a crystal growth surface of the second substrate faces upwards.

15. The method of claim 14, further comprising growing aluminum nitride crystal on the second substrate.

16. The method of claim 8, wherein a mixing ratio of silicon:aluminum:gallium in the mixed source is 1-10:1-5:1.

17. The method of claim 8, wherein a growth ratio of the hexagonal Si crystal becomes higher as the mixing ratio of silicon the mixed source is higher.

18. The method of claim 8, wherein a length and/or a diameter of the hexagonal Si crystal become greater as the mixing ratio of silicon in the mixed source is higher.

* * * * *